United States Patent
Mehrnia et al.

(10) Patent No.: US 9,374,067 B2
(45) Date of Patent: Jun. 21, 2016

(54) OPTIMALLY FACTORED INTERPOLATED FIR FILTER DESIGN

(71) Applicant: PENTOMICS, INC., Pasadena, CA (US)

(72) Inventors: Alireza Mehrnia, Pasadena, CA (US); Alan N. Willson, Jr., Pasadena, CA (US)

(73) Assignee: Pentomics, Inc., Pasadena, CA (US)

( * ) Notice: Subject to any disclaimer, the term of this patent is extended or adjusted under 35 U.S.C. 154(b) by 0 days.

(21) Appl. No.: 14/641,234

(22) Filed: Mar. 6, 2015

(65) Prior Publication Data

US 2015/0256150 A1     Sep. 10, 2015

Related U.S. Application Data

(60) Provisional application No. 61/949,205, filed on Mar. 6, 2014.

(51) Int. Cl.
    *H03H 17/02*         (2006.01)

(52) U.S. Cl.
    CPC ................................. *H03H 17/0248* (2013.01)

(58) Field of Classification Search
None
See application file for complete search history.

(56) References Cited

U.S. PATENT DOCUMENTS

| | | | | |
|---|---|---|---|---|
| 8,650,236 B1 * | 2/2014 | Chou | ................. | H03H 17/0275 708/313 |
| 2009/0122930 A1 * | 5/2009 | Menkhoff | .......... | H03H 17/0276 375/350 |

OTHER PUBLICATIONS

Nuevo, et al., "Interpolated finite impulse response filters," IEEE Trans. Acoustics, Speech and Signal Processing, vol. ASSP-32, No. 6, pp. 563-570, Jun. 1984.
Saramaki, et al., "Design of computationally efficient interpolated FIR filters," IEEE. Trans, Circuits and Systems, vol. 35, pp. 70-88, Jan. 1988.
Mehrnia, et al., "On optimal IFIR filter design," Proc. IEEE Int. Symposium on Circuits and Systems, vol. 3, pp. 133-136, May 2004.
Mehrnia, et al., "Optimal Factoring of FIR Filters (Part 1)," to be submitted for possible publication in IEEE Trans. Circuits and Systems I, Copyright 2015.
Mehrnia, et al., "Optimal Factoring of FIR Filters (Part 2)," to be submitted for possible publication in IEEE Trans. Circuits and Systems I, Copyright 2015.
Aktan, et al., "An algorithm for the design of low-power hardware-efficient FIR filters," IEEE Trans. Circuits and Systems I, vol. 55, No. 6, pp. 1536-1545, Jul. 2008.
Willson, A., "Desensitized half-band filters," IEEE Trans. Circuits and Systems I, vol. 57, No. 1, pp. 152-165, Jan. 2010.

(Continued)

*Primary Examiner* — Michael D Yaary
(74) *Attorney, Agent, or Firm* — Sterne, Kessler, Goldstein & Fox P.L.L.C.

(57) ABSTRACT

A method and system for the design and implementation of an optimally factored interpolated finite impulse response (IFIR) filter is presented. Techniques used to increase the implementation efficiency of the filter include joint sequencing of the filter stages, use of an nested IFIR filter, taming of a stage by relocation of that stage, fusing two or more stages together to form a single stage, and manual manipulation of a post-stage multiplier. IFIR filters using this approach may be realized as low pass filters or high pass filters, and in either analog or digital form.

27 Claims, 42 Drawing Sheets

(56) References Cited

OTHER PUBLICATIONS

Samueli, H., "An improved search algorithm for the design of multiplierless FIR filters with powers-of-two coefficients," IEEE Trans. Circuits Syst., vol. 36, No. 7, pp. 1044-1047, Jul. 1989.
Shi, et al., "Design of linear phase FIR filters with high probability of achieving minimum number of adders," IEEEE Trans. Circuits and Systems I, vol. 58, No. 1, pp. 126-136, Jan. 2011.
Lim, et al., "Discrete coefficient FIR digital filter design based upon an LMS criteria," IEEE Trans. Circuits and Systems, vol. CAS-30, No. 10, pp. 723-739, Oct. 1983.
Yao, et al., "A partial MILP algorithm for the design of linear phase FIR filters with SPT coefficients," IEICE Trans. Fundamentals, vol. E85-A, pp. 2302-2310, Oct. 2002.
English Language Abstract of Yao, et al., "A high-level synthesis procedure for linear-phase fixed-point FIR filters with SPT coefficients," Int. J. Elect. Eng., vol. 12, No. 1, pp. 75-84, 2005.
Faust, et al., "Optimization of structural adders in fixed coefficient transposed direct form FIR filters," Proc. IEEE Int. Symposium on Circuits and Systems, pp. 2185-2188, May 2009.
Lim, Y., "Frequency-response masking approach for the synthesis of sharp linear phase digital filters," IEEE Trans. Circuits Syst., vol. CAS-33, No. 5, pp. 357-364, 1986.
Lim, et al., "The optimum design of one- and two-dimensional FIR filters using the frequency response masking technique," IEEE Trans. Circuits and Systems II, vol. CAS-40, No. 2, pp. 88-95, Feb. 1993.
Mehrnia, et al., "Further Desensitized FIR Halfband Filters," accepted for publication in IEEE Transactions on Circuits and Systems, to be published late 2015 / early 2016.
Schuessler, W., "On structures for nonrecursive digital filters," Arch. Elek. Übertragung, vol. 26, No. 6, pp. 255-258, Jun. 1972.
Chan, et al., "An algorithm for minimizing roundoff noise in cascade realizations of finite impulse response digital filters," Bell Syst. Tech. J., vol. 52, No. 3, pp. 347-385, Mar. 1973.
Nakamura, et al., "Design of FIR digital filters using tapped cascaded FIR subfilters," Circuits, Systems, and Signal Processing, vol. 1, No. 1, pp. 43-56, 1982.
Adams, et al., "A new approach to FIR digital filters with fewer multipliers and reduced sensitivity," IEEE Trans. Circuits Syst., vol. CAS-30, No. 5, pp. 277-283, May 1983.
Vaidyanathan, et al., "On prefilters for digital FIR filter design," IEEE Trans. Circuits Syst., vol. CAS-32, pp. 494-499, 1985.
Mehrnia, et al., "Optimal factoring of FIR filters," IEEE Trans. Signal Processing, vol. 63, No. 3, Feb. 1, 2015; pp. 647-661.
Mehrnia, et al., "Hardware-Efficient Filter Design via Generalized Optimal Factoring—Part 1: Method," submitted for possible publication in IEEE Trans. Circuits and Systems I, Copyright 2015.
Mehrnia, et al., "Hardware-Efficient Filter Design via Generalized Optimal Factoring—Part 2: Design Examples," submitted for possible publication in IEEE Trans. Circuits and Systems I, Copyright 2015.
McClellan, et al., "A computer program for designing optimum FIR linear phase digital filters," IEEE Trans. Audio Electroacoust., vol. AU-21, pp. 506-526, Dec. 1973.
Gustafsson, O., "Lower bounds for constant multiplication problems," IEEE Trans. Circuits Syst. II, Exp. Briefs, vol. 54, No. 11, pp. 974-978, Nov. 2007.
Dempster, et al., "Use of minimum-adder multiplier blocks in FIR digital filters," IEEE Trans. Circuits Syst. II, Analog Digit. Signal Process., vol. 42, No. 9, pp. 569-577, Sep. 1995.
Yu, et al., "Design of linear phase FIR filters in subexpression space using mixed integer linear programming," IEEE Trans. Circuits and Syst. I, vol. 54, No. 10, pp. 2330-2338, Oct. 2007.
Shi, et al., "Design of discrete-valued linear phase FIR filters in cascade form," IEEE Trans. Circuits and Systems I, vol. 58, No. 7, pp. 1627-1636, Jul. 2011.
Ye, et al., "Single-stage and cascade design of high order multiplierless linear phase FIR filters using genetic algorithm," IEEE Trans. Circuits and Systems I, vol. 60, pp. 2987-2997, Nov. 2013.
Lim, et al., "The Design of Cascaded FIR Filters," IEEE International Symposium on Circuits and Systems, vol. 2, pp. 181-184, 1996.
Saramaki, T., "Design of FIR Filters as a Tapped Cascaded Interconnection of Identical Subfilters," IEEE Trans. Circuits and Systems, vol. CAS-34, No. 9, pp. 1011-1029, Sep. 1987.
Cabezas, et al., "FIR Filters Using Interpolated Prefilters and Equalizers," IEEE Trans. Circuits and Systems, vol. 37, No. 1, pp. 17-23, Jan. 1990.
Lian, et al., "New Prefilter Structure for Designing FIR Filters," Electronics Letters, vol. 29, No. 11, pp. 1034-1036, May 27, 1993.
Shively, R., "On Multistage Finite Impulse Response (FIR) Filters with Decimation," IEEE Trans. Acoustics, Speech, and Signal Processing, vol. ASSP-23, No. 4, pp. 353-357, Aug. 1975.
Adams, et al., "Some Efficient Digital Prefilter Structures," IEEE Trans. Circuits and Systems, vol. CAS-31, No. 3, pp. 260-266, Mar. 1984.
Smith, et al., "Statistical Design of Cascade Finite Wordlength FIR Digital Filters," IEEE International Conference on Acoustics, Speech and Signal Processing, vol. 9, pp. 583-585, Mar. 1984.
Saramaki, et al., "Subfilter Approach for Designing Efficient FIR Filters," IEEE International Symposium on Circuits and Systems, Espoo, Finland, pp. 2903-2915, 1988.
Chan, et al., "Theory of Roundoff Noise in a Cascade Realizations of Finite Impulse Response Digital Filters," Bell System Technical Journal, vol. 52, No. 3, pp. 329-345, Mar. 1973.
Mitra, S., "Cascade Form FIR Digital Filter Structures," PowerPoint Presentation, Copyright 2001.
Mehrnia, et al., "Optimally-Factored Interpolated FIR Filter design—Part 1 and Part 2," submitted for possible publication in IEEE, Copyright 2015.
Mehrnia, et al., "FIR Filter Design via Extended Optimal Factoring," submitted for possible publication in IEEE, Copyright 2015.

\* cited by examiner

US 9,374,067 B2

OPTIMALLY FACTORED INTERPOLATED FIR FILTER DESIGN

CROSS-REFERENCE TO RELATED APPLICATIONS

This patent application claims the benefit of Provisional Patent Application No. 61/949,205, filed Mar. 6, 2014, the disclosure of which is incorporated herein by reference in its entirety.

This application is related to U.S. Provisional Application No. 61/941,966, filed Feb. 19, 2014, and U.S. patent application Ser. No. 14/626,292, filed Feb. 19, 2015, each of which are herein incorporated by reference in their entireties.

FIELD

The invention relates generally to digital filters.

BACKGROUND

Finite impulse response (FIR) filters are commonly used digital filters. An FIR filter has an impulse response that settles to zero in a finite number of sample periods. FIR filters are inherently stable because FIR filters require no feedback and have their poles at the origin (within the unit circle of the complex z plane). However, all digital filters, including FIR filters, are sensitive to perturbations in the filter's tap coefficients.

A digital filter constructed as a cascade of two or more sub-filters can possess the capability of lowering the filter's sensitivity to these filter coefficient perturbations. This property is described in J. W. Adams and A. N. Willson, Jr., "A new approach to FIR digital filters with fewer multipliers and reduced sensitivity," *IEEE Trans. Circuits Syst.*, vol. CAS-30, pp. 277-283, May 1983 [referred to herein as "Adams"], which is herein incorporated by reference in its entirety.

A crucial capability for building such filters concerns finding the best FIR filter factors, then carefully scaling and sequencing them. The efficiency of the resulting structure depends heavily upon obtaining such optimal factors.

SUMMARY

According to an embodiment, a filter designed to receive an input signal and generate an output signal includes a first interpolated finite impulse response (IFIR) sub-filter and a second IFIR sub-filter. The first IFIR sub-filter includes a plurality of first stages, wherein each stage of the plurality of first stages has an order of four or greater. The second IFIR sub-filter includes a plurality of second stages, wherein each stage of the plurality of second stages has an order of less than four. A total order of the first plurality of stages is higher than a total order of the second plurality of stages.

According to an embodiment, a method of designing an interpolated finite impulse response (IFIR) filter based on filter specifications is described. The IFIR filter includes a cascade of a first finite impulse response (FIR) filter and a second FIR filter, where the first FIR filter and the second FIR filter includes a first plurality of stages and a second plurality of stages respectively. Joint sequencing the stages of the first FIR filter and the stages of the second FIR filter is performed, where joint sequencing moves one stage of either the first FIR filter and the second FIR filter and places said stage in the other FIR filter.

According to an embodiment, an optimized hardware-implemented filter is described. The filter is associated with a first IFIR sub-filter and a second IFIR sub-filter, where the first IFIR sub-filter has a first plurality of stages and the second IFIR sub-filter has a second plurality of stages. The optimized hardware-implemented filter includes an updated first IFIR sub-filter and an updated second IFIR sub-filter. The updated first IFIR sub-filter has a stage of the first plurality of stages removed from the first IFIR sub-filter. The updated second IFIR sub-filter has this same stage (which was removed from the first IFIR sub-filter) inserted into the second plurality of stages.

BRIEF DESCRIPTION OF THE DRAWINGS/FIGURES

Figure 1:
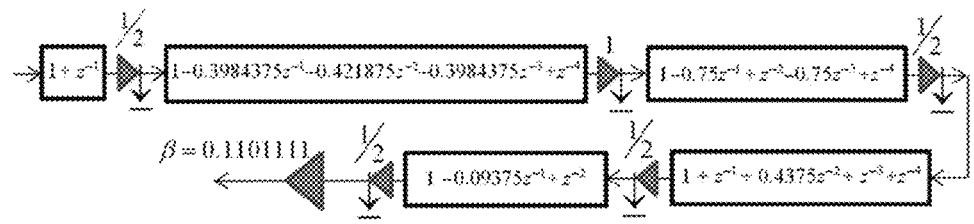
FIG. 1 depicts an exemplary optimally-factored non-IFIR cascade filter implementation, zero map of the optimally-paired zeros and frequency response (magnitude in dB) for order-15 narrow-band lowpass filter (Example 1).
Figure 1:
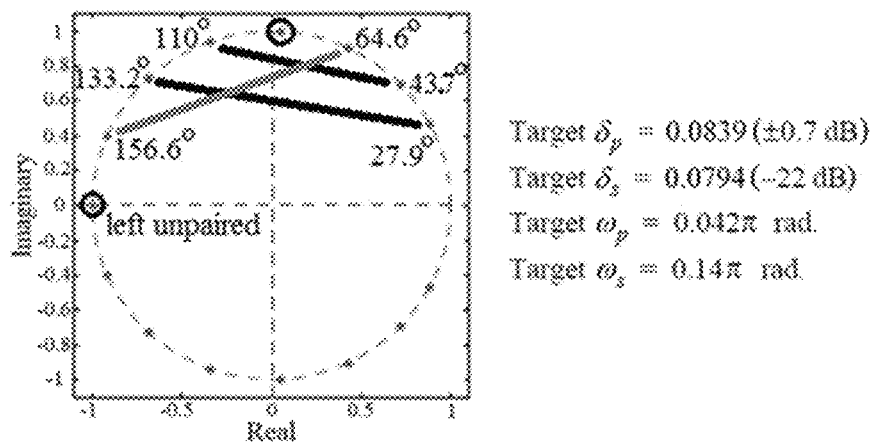
Figure 1:
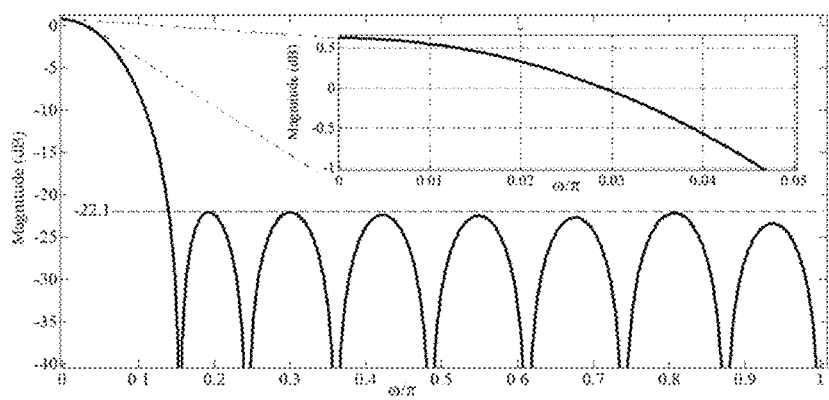

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it is submitted that it is within the knowledge of one skilled in the art to affect such feature, structure, or characteristic in connection with other embodiments whether or not explicitly described.

Other embodiments are possible, and modifications may be made to the embodiments within the spirit and scope of the invention. Therefore, the detailed description is not meant to limit the invention. Rather, the scope of the invention is defined by the appended claims.

I. OVERVIEW

The notion of an interpolated FIR filter (usually called simply an "IFIR filter") is, in its simplest form, a filter architecture that can especially be very efficient for implementing narrow-band lowpass FIR filters. An IFIR filter H(z) is constructed by a cascade connection of two FIR filters H(z)=G(Z)I(z) where the n-tap FIR filter G(z) (often called the model filter) has its argument z replaced by $z^L$ for some given positive integer L (called the "stretch factor," which will subsequently be referred to as "SF") and this replacement is equivalent to "stretching" the length of filter G to become approximately L times as long—more precisely, it will have 1+(n−1)L taps (with many tap coefficients being of value zero, hence zero hardware cost for their tap-coefficient multipliers and structural adders). Such stretching in the time domain is equivalent to "shrinking" the transfer function $G(e^{j\omega})$ by the factor L in the frequency domain, since it becomes $G(e^{j\omega L})$, which is a reason why such lowpass filters can tend to be efficient at implementing narrow-band lowpass filter specifications. Doing such frequency-domain shrinking, however, causes unwanted passbands to appear, centered at $2\pi/L, 4\pi/L, \ldots, 2\pi(L-1)/L$, and these unwanted passbands must be eliminated (or masked) by use of the (cheap, because of its wide transition-band) lowpass filter I(z), which is called the interpolator or masking filter. More details on IFIR filters and their properties may be found in the following references: Y. Neuvo, D. Cheng-Yu, and S. K. Mitra, "*Interpolated finite impulse response filters,*" IEEE Trans. Acoustics, Speech and Signal Processing, vol. ASSP-32, no. 6, pp. 563-570, June 1984 [referred to herein as "Neuvo" or "[1]"]. Y. C. Lim "*Frequency-response masking approach for the synthesis of sharp linear phase digital filters*", IEEE Trans. Circuits Syst., vol. CAS-33, no. 5, pp. 357-364, 1986 [referred to herein as "Lim I" or "[2]"]; and T. Saramaki, Y. Neuvo, and S. K. Mitra, *"Design of computationally efficient interpolated FIR filters,"* IEEE Trans. Circuits and Systems, vol. 35, pp. 70-88, January 1988 [referred to herein as "Saramaki" or "[3]"]. How to choose an optimum stretch-factor when designing a filter to meet given passband and stopband specifications may be found in the following references: A. Mehrnia and A. N. Willson, Jr., *"On optimal IFIR filter design,"* in Proc, IEEE Int. Symposium on Circuits and Systems, vol. 3, pp. 133-136, May 2004 [referred to herein as "Mehrnia I" or "[4]"]; and Y. C. Lim and Y. Lian, *"The optimum design of one- and two-dimensional FIR filters using the frequency response masking technique,"* IEEE Trans. Circuits and Systems II, vol. CAS-40, no. 2, pp. 88-95, February 1993 [referred to herein as "Lim II" or "[5]"]. Furthermore, insights from the following references suggest that the implementation complexity of a digital filter can be reduced when the filter is constructed as a cascade of factors: J. W. Adams and A. N. Willson, Jr., *"A new approach to FIR digital filters with fewer multipliers and reduced sensitivity,"* IEEE Trans. Circuits Syst., vol. CAS-30, no. 5, pp. 277-283, May 1983 [referred to herein as "Adams" or "[6]"]; W. Schüssler, *"On structures for nonrecursive digital filters,"* Arch. Elek. Übertragung, vol. 26, no. 6, pp. 255-258, June 1972 [referred to herein as "Schüssler" or "[7]"]; D. S. K. Chan and L. R. Rabiner, *"An algorithm for minimizing roundoff noise in cascade realizations of finite impulse response digital filters,"* Bell Syst. Tech. J., vol. 52, no. 3, pp. 347-385. March 1973 [referred to herein as "Chan" or "[8]"]; S. Nakamura and S. K. Mitra, *"Design of FIR digital filters using tapped cascaded FIR subfilters,"* Circuits, Systems and Signal Processing, vol. 1, no. 1, pp. 43-56, 1982 [referred to herein as "Nakamura" or "[9]"]; A. N. Willson, Jr., *"Desensitized half-band filters,"* IEEE Trans. Circuits and Systems I, vol. 57, no. 1, pp. 152-165, January 2010 [referred to herein as "Willson" or "[10]"]; A. Mehrnia and A. N. Willson Jr., *"Further Desensitized FIR halfband filters,"* submitted to *IEEE Transactions on Circuits and Systems I* [referred to herein as "Mehrnia II" or "[11]"]; P. P. Vaidyanathan and G. Beitman, *"On prefilters for digital FIR filter design,"* IEEE Trans. Circuits Syst., vol. CAS-32, pp. 494-499, 1985 [referred to herein as "Vaidyanathan" or "[12]"]; A. Mehrnia and A. N. Willson, Jr., *"Optimal factoring of FIR filters,"* IEEE Trans. Signal Processing, vol. 63, no. 3, pp. 647-661, February 2015 [referred to herein as "Mehrnia III" or "[13]"]; A. Mehrnia and A. N. Willson Jr., *"Hardware-Efficient Filter Design via Generalized Optimal Factoring—Part 1: Method,"* submitted to *IEEE Transactions on Circuits and Systems I* [referred to herein as "Mehrnia IV" or "[14]"]; and A. Mehrnia and A. N. Willson Jr., *"Hardware-Efficient Filter Design via Generalized Optimal Factoring—Part 2: Design Examples,"* submitted to *IEEE Transactions on Circuits and Systems I* [referred to herein as "Mehrnia V" or "[15]"]. FIG. 1 shows a non-interpolated optimally-factored cascade filter implementation (see Mehrnia III and Mehrnia IV), that meets the target passband and stopband specifications, also indicated in FIG. 1. As illustrated in the zero map, the optimally-factored cascade structure is obtained by factoring the Parks-McClellan (J. H. McClellan, T. W. Parks, and L. R. Rabiner, *"A computer program for designing optimum FIR linear phase digital filters,"* IEEE Trans. Audio Electroacoust., vol. AU-21, pp. 506-526, December 1973 [referred to herein as "Parks-McClellan" or "[16]"]), order-15 transfer function H(z) into its natural $2^{nd}$-order factors and then pairing the following zero-pair factors (27.9°, 133.2°), (43.7°, 110°), (64.6°, 156.6°) resulting in the three $4^{th}$-order factors (shown in FIG. 1) and leaving the 180° zero and 87° zero-pair stand alone as the $1^{st}$-order and $2^{nd}$-order blocks shown in the FIG. 1 cascade implementation.

Various approaches are described herein that further increase an interpolated FIR filter's efficiency by making use of such optimal factoring (see Mehrnia III, Mehrnia IV and Mehrnia V) of FIR filters in the construction of optimally-factored interpolated filters. Section II provides an illustration of the approach by presenting the optimal factoring of the optimally-stretched interpolated FIR design of the aforementioned order-15 filter (see Mehrnia III) (Example 1). Two near-optimum choices of stretch factor (SF) are examined and the effect of the SF on the factored implementation is discussed. The new concept of joint versus individual sequencing of cascade stages of the model filter and the interpolator filter is also introduced. The resulting filter structures are compared with the non-interpolated optimally-factored design (FIG. 1) and with the conventional Remez implementation. Additional techniques and benefits are also presented in Section III and Section IV by examining the optimally-factored interpolated FIR design of a high order narrowband filter (Section III) and a wideband filter (Section IV). Further properties and the flexibility of the factored IFIR structure are also examined to demonstrate that it is possible to further simplify a specific stage (or stages!) of the optimally-factored IFIR cascade structure without the need to change any of the other stages. Additional alternative implementations of the factored IFIR design are presented in Sections V and VI using three filter examples to further illustrate the proposed filter design approach and its practical applications.

II. NARROW-BAND FILTER DESIGN EXAMPLE: CHOICE OF STRETCH FACTOR AND JOINT STAGE SEQUENCING TECHNIQUE

Example 1

Figure 2:
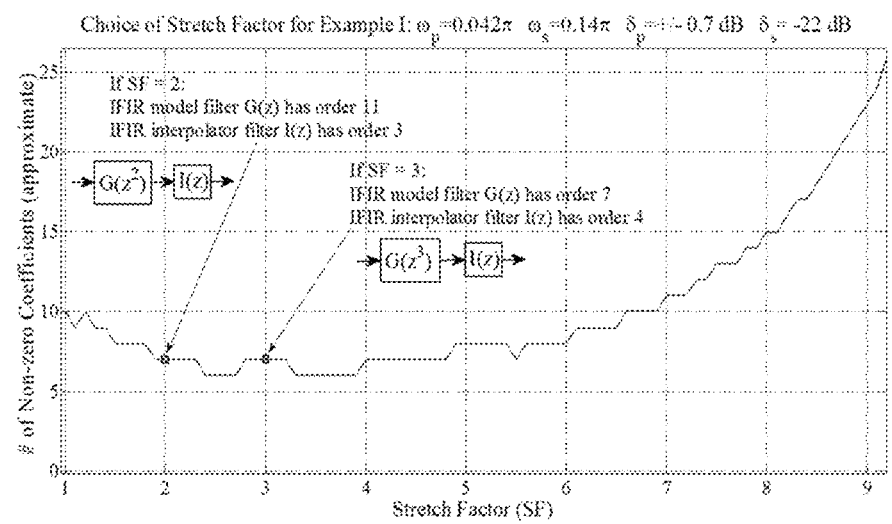
FIG. 2 depicts an exemplary choice of optimum stretch factor for 16-tap filter (Example 1).

According to an embodiment, the small 16-tap (order-15) lowpass FIR filter of FIG. 1 is used to illustrate some of the basic concepts for optimally-factored interpolated FIR filter design. Using Mehrnia I, the choice of the optimum stretch factor for this filter is indicated in FIG. 2, which shows two potential choices of optimum stretch factor (SF=2 or 3). The detailed comparison of hardware requirements for these two choices is provided in Table 1, where it is summarized that SF=3 is the better choice, with a slightly higher hardware efficiency than the SF=2 case. The hardware efficiency of a given structure is assessed by computing the "total complexity," which is defined as the sum of all full-adders and all flip-flops needed to implement the structure—and the most efficient implementation is the one for which this total complexity is smallest. Notice that final implementation costs will ultimately involve the details of the specific implementation. A more detailed discussion of multiplier and structural adder design considerations for conventional filter structures may be found in the following references: M. Faust and C. H. Chang, *"Optimization of structural adders in fixed coefficient transposed direct form FIR filters,"* in Proc. IEEE Int. Symp. on Circuits Syst. ISCAS 2009, Taipei, Taiwan, pp. 2185-2188, May 2009 [referred to herein as "Faust" or "[17]"]; O. Gustafsson, *"Lower bounds for constant multiplication problems,"* IEEE Trans. Circuits Syst. II, Exp. Briefs, vol. 54, no. 11, pp. 974-978, November 2007 [referred to herein as "Gustafsson" or "[18]"]; and A. G. Dempster and M. D. Macleod, *"Use of minimum-adder multiplier blocks in FIR digital filters,"* IEEE Trans. Circuits Syst. II, Analog Digit. Signal Process., vol. 42, no. 9, pp. 569-577, September 1995 [referred to herein as "Dempster" or "[19]"]. The "total complexity" hardware efficiency assessment has also been employed elsewhere (see Mehrnia III; Mehrnia V; and M.

Aktan, A. Yurdakul, and G. Dündar, "*An algorithm for the design of low-power hardware-efficient FIR filters,*" IEEE Trans. Circuits and Systems I, vol. 55, no. 6, pp. 1536-1545, July 2008 [referred to herein as "Aktan" or "[20]"]), and the adding of flip-flop cost to the full-adder cost certainly seems particularly appropriate for IFIR filters because the filter order may substantially increase, resulting in a significant cost for the additional delay elements in IFIR structures, even though the cost of its multipliers and adders is being reduced.

TABLE 1

Hardware Complexity Summary and Comparison

| Hardware complexity for alternative filter design methods | multiplier adders | structural adders | post-filter multiplier adders (gain adjustment) | full adders | D flip-flops | total complexity |
|---|---|---|---|---|---|---|
| Remez (direct form) B = 5 + 1 bits | 15 | 15 | 0 | >198 | 90 | >288 |
| non-IFIR (optimally-factored) B = 6 + 1 bits | 7 | 15 | 1 | 154 (+6 if post-filter gain adjustment multiplier is also counted) | 105 | 259 |
| optimally-factored IFIR (SF = 2) B = 5 + 1 bits | 0 | 13 | 1 | 78 (+6 if post-filter gain adjustment multiplier is also counted) | 150 | 228 |
| optimally-factored IFIR (SF = 3) B = 5 + 1 bits | 0 | 11 | 2 | 66 (+12 if post filter gain adjustment multiplier is also counted) | 150 | 216 |

Figure 3:
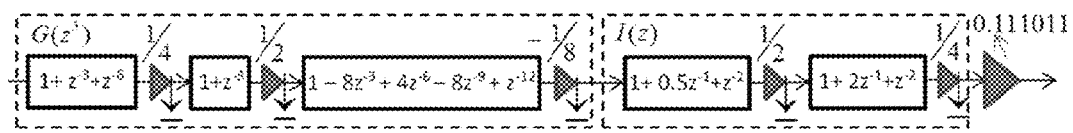
FIG. 3 depicts an exemplary best identified cascade of an optimally-factored individually sequenced $G(z^3)$ and $I(z)$ (when SF=3).

In the case of SF=3 for this example, the $G(z)$ and $I(z)$ sub-filters are of degree 7 and 4 (FIG. 2), respectively. The cascade of an optimally-factored $G(z^3)$ and $I(z)$ is shown in FIG. 3, where the factors of both filters have been identified by using the optimal factoring theory and algorithm of Mehrnia III. This is referred to as the optimally double-factored IFIR or simply "optimally-factored IFIR" implementation of $H(z)$ since both $G(z^3)$ and $I(z)$ are factored. The resulting FIG. 3 structure has only trivial coefficients (i.e., all are exact powers of 2) and it needs only seven and four structural adders for the IFIR components, as well as two shift-adds (defined to be a hard-wired shift and an addition) to implement the post-filter compensation multiplier (if ~0.7 dB DC gain is desired). The sequencing of stages for both $G(z^3)$ and $I(z)$ is determined as explained in Mehrnia III. The down-arrow symbol at the output of each stage shifter represents a data-path truncation operation.

Figure 5:
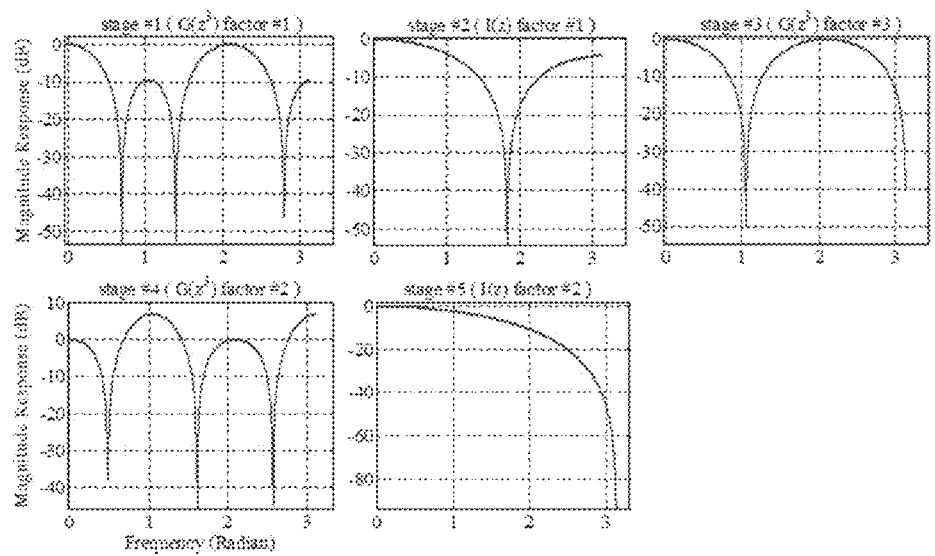
FIG. 5 depicts magnitude plots of five stages of the jointly sequenced optimally-factored optimally stretched IFIR cascade filter structure illustrated in FIG. 4.
Figure 6:
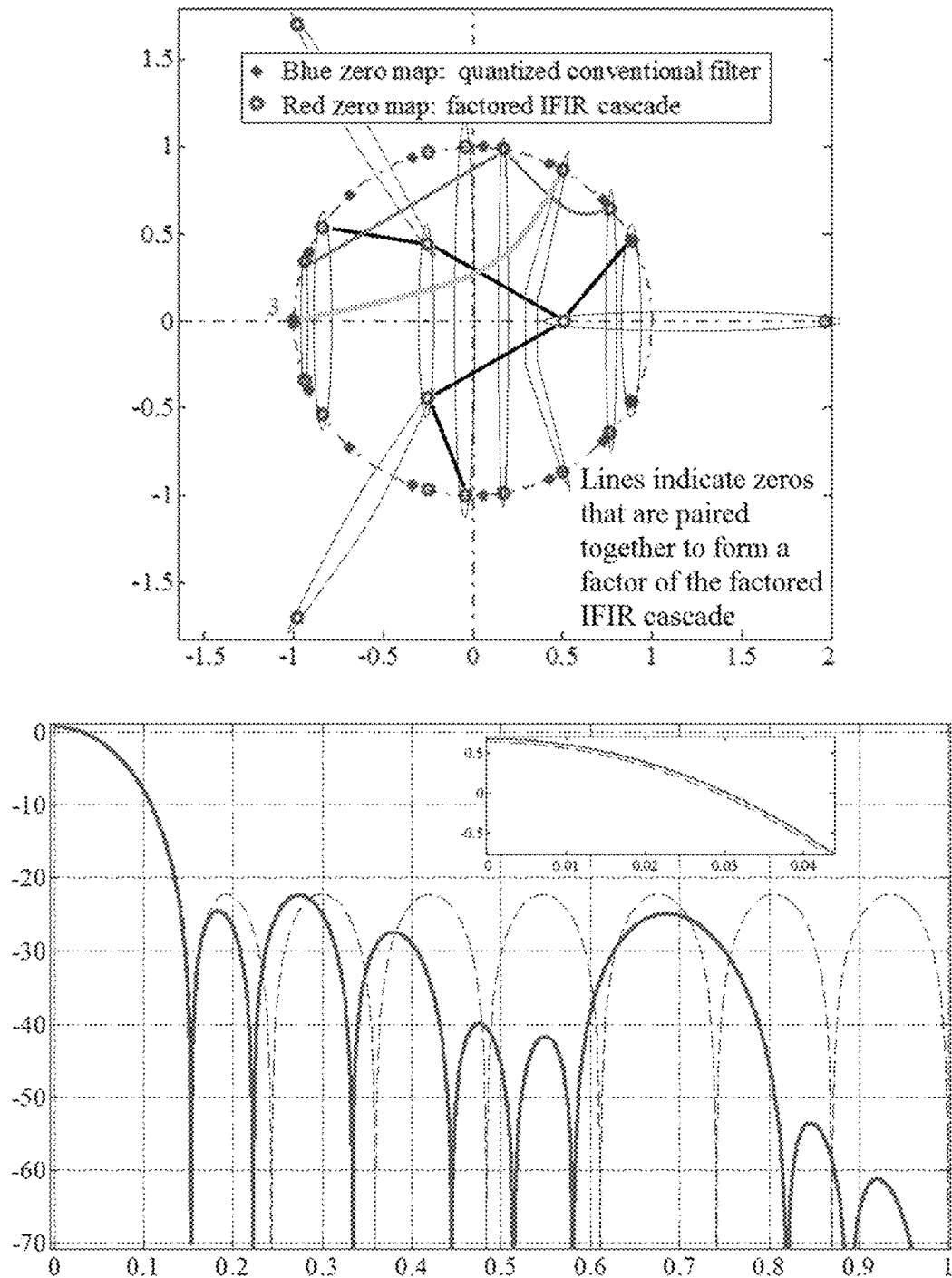
FIG. 6 depicts zero-map and magnitude plots of the exemplary optimally-factored IFIR (SF=3) filter (solid) versus 16-tap conventional filter (dashed).

In addition to the complexity reduction evident in FIG. 3, the optimally-factored IFIR design provides the additional opportunity to combine and/or jointly sequence the factors of both $G(z^3)$ and $I(z)$. Such flexibility allows one to neutralize (or "tame") any challenging factor in the resulting cascade (see Mehrnia III and Mehrnia V). In this example, since the FIG. 3 implementation is already multiplier-free, there seems to be no benefit in the further combining (fusing) of stages. There can however be a benefit from the joint sequencing of stages—which yields the cascade structure of FIG. 4 whose five stages have the frequency responses shown in FIG. 5. The overall magnitude (dB) of the optimally-factored IFIR filter demonstrates superior stopband characteristics (more attenuation) especially at mid and high frequencies compared to those of the conventional structure (the dashed line) as shown in FIG. 6. The zero-maps of both quantized conventional and optimally-factored IFIR implementations are also shown in FIG. 6.

Figure 7:
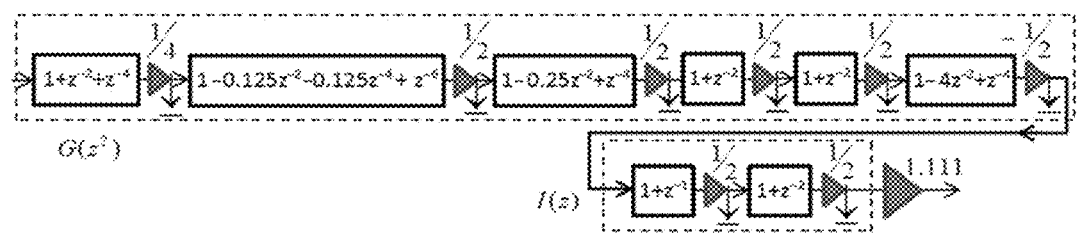
FIG. 7 depicts an exemplary best identified cascade of an optimally-factored $G(z)^2$ and $I(z)$ (when SF=2).
Figure 8:
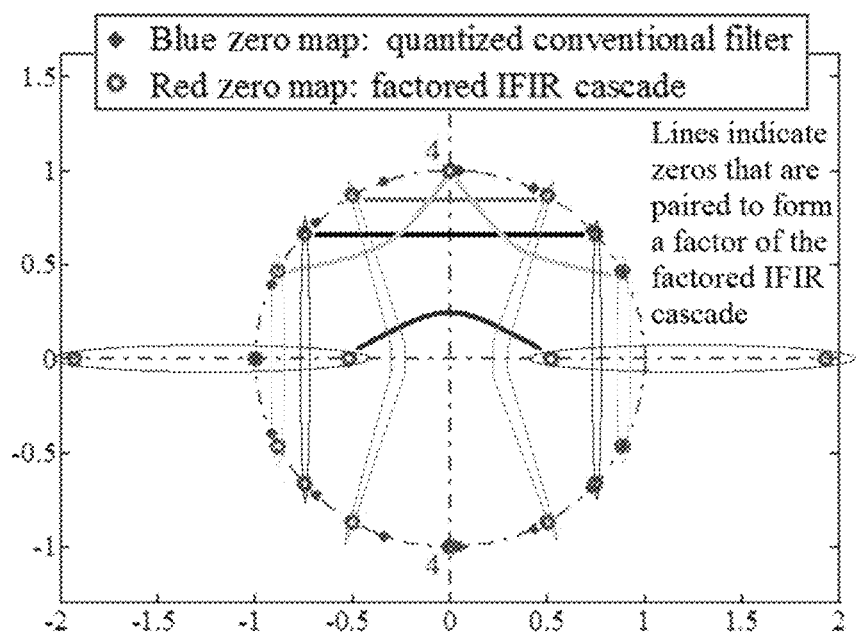
FIG. 8 depicts a zero-map and magnitude plot of the exemplary optimally-factored IFIR (SF=2) filter (solid) vs. 16-tap conventional (dashed).
Figure 8:
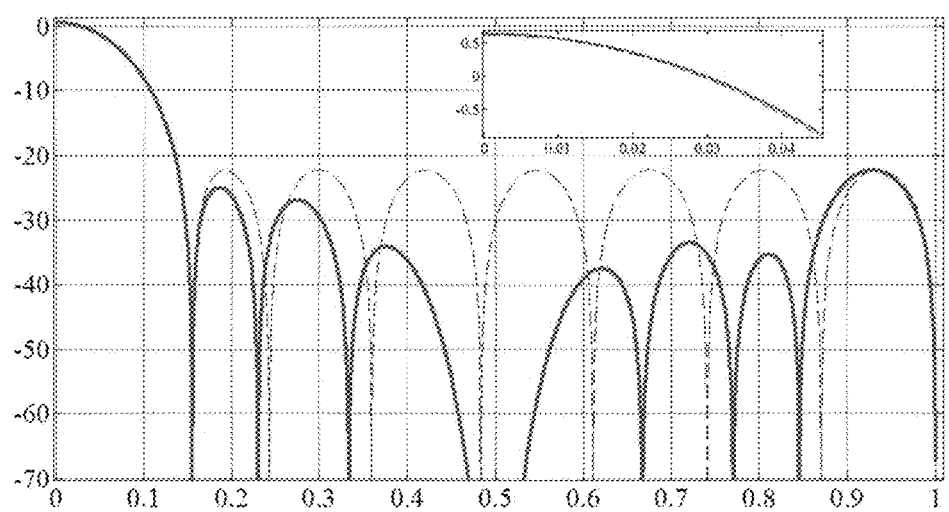

In the case of SF=2 for this example, the $G(z)$ and $I(z)$ sub-filters have degrees 11 and 3, respectively, and the corresponding cascade of an optimally-factored $G(z^2)$ and $I(z)$ is shown in FIG. 7. Again, the resulting structure has only trivial coefficients and needs just eleven and two structural adders for the IFIR components, in addition to one shift-add to implement the post-filter gain compensation multiplier. The sequencing of stages for both $G(z^2)$ and $I(z)$ is again based on the method described in Mehrnia III. The frequency response (FIG. 8) of the resulting optimally-factored IFIR filter (for SF=2) demonstrates superior stopband characteristics compared to that of the conventional structure (dashed line). The zero-maps of both implementations are also shown in FIG. 8. The lines indicate which zeros are paired together to form each of the factors of the optimally-factored IFIR structure in FIG. 7. Notice that there are four zeros with 90° angle (and naturally four corresponding complex conjugate zeros with −90° angle). Three of them are left unpaired and one is paired with two other zero-pairs with angles 27.9° and 152.1° shown in FIG. 8.

The comparison of hardware complexity for the optimally-factored IFIR vs. both the (non-IFIR) optimally-factored filter as well as the conventional (direct form) FIR filter, is given in Table 1. For the case of 22-dB stopband attenuation in Example 1 the wordlength of the signal path, excluding sign bit, should have at least six bits (including sign bit) for the optimally-factored IFIR cascade implementations, depending on the target application. Table 1 summarizes the hardware complexity comparison for the four implementation methods. The optimally-factored IFIR has the fewest adders and it has the lowest total complexity.

III. NARROW-BAND FILTER EXAMPLE: OPTIMALLY-INTERPOLATED FACTORED DESIGN AND ADDITIONAL BENEFITS

Example 2

Figure 9:
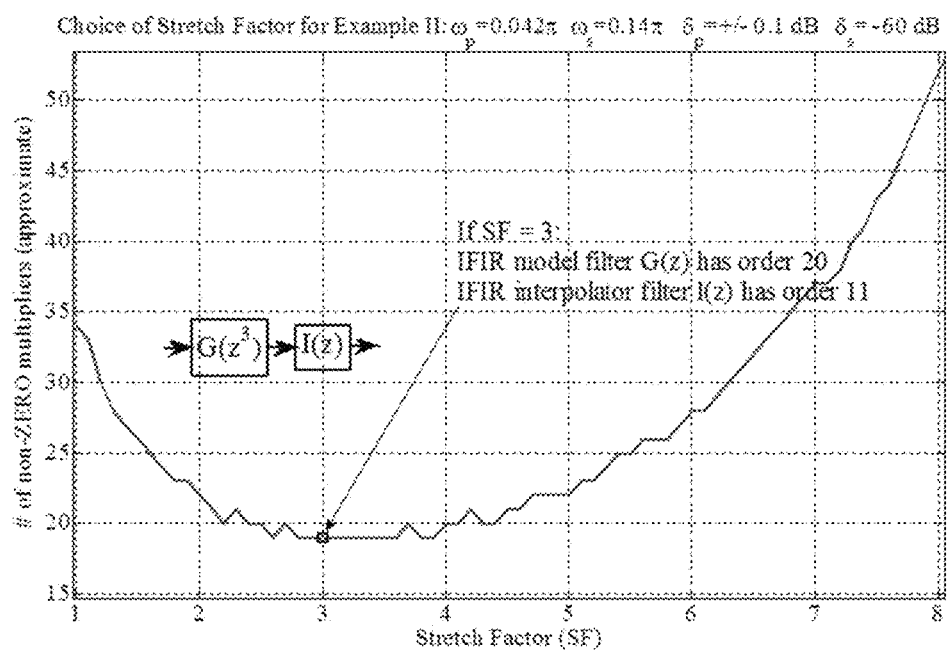
FIG. 9 depicts finding an exemplary optimum SF for 60-tap filter (Example 2).

A larger FIR filter is now considered, one that has also been examined in Mehrnia III where a non-IFIR factored cascade implementation was created. This 60-tap lowpass filter, also referred to as filter S2 in Aktan, is a good example because others have chosen to use this filter when presenting their own filter design and implementation methods. Others that have chosen to use this filter include: H. Samueli, "*An improved search algorithm for the design of multiplierless FIR filters with powers-of-two coefficients*," IEEE Trans. Circuits Syst., vol. 36, no. 7, pp. 1044-1047, July 1989 [referred to herein as "Samueli" or "[21]"]; Y. C. Lim and S. R. Parker, "*Discrete coefficient FIR digital filter design based upon an LMIS criteria*," IEEE Trans. Circuits and Systems, vol. CAS-30, no. 10, pp. 723-739, October 1983 [referred to herein as "Lim III" or "[22]"]; C.-Y. Yao and C.-J. Chien, "*A partial MILP algorithm for the design of linear phase FIR filters with SPT coefficients*," IEICE Trans. Fundamentals, vol. E85-A, pp. 2302-2310. October 2002 [referred to herein as "Yao I" or "[23]"]; C.-Y. Yao, H. H. Chen, C.-Y. Chien, and C.-T. Hsu, "*A high-level synthesis procedure for linear-phase fixed-point FIR filters with SPT coefficients*," Int. J. Elect. Eng., vol. 12, no. 1, pp. 75-84, 2005 [referred to herein as "Yao II" or "[24]"]; Y. J. Yu and Y. C. Lim, "*Design of linear phase FIR filters in subexpression space using mixed integer linear programming*," IEEE Trans. Circuits and Syst. L vol. 54, no. 10, pp. 2330-2338, October 2007 [referred to herein as "Yu" or "[25]"]; D. Shi and Y. J. Yu, "*Design of linear phase FIR filters with high probability of achieving minimum number of adders*," IEEE Trans. Circuits and Systems I, vol. 58, no. 1, pp. 126-136, January 2011 [referred to herein as "Shi I" or "[26]"]; D. Shi and Y. J. Yu, "*Design of discrete-valued linear phase FIR filters in cascade form*," IEEE Trans. Circuits and Systems 1, vol. 58, no. 7, pp. 1627-1636. July 2011 [referred to herein as "Shi II" or "[27]"]; and W. B. Ye and Y. J. Yu, "*Single-stage and cascade design of high order multiplierless linear phase FIR filters using genetic algorithm*," IEEE Trans. Circuits and Systems I, vol. 60, pp. 2987-2997. November 2013 [referred to herein as "Ye" or "[28]"]. This filter has the following specifications:

Target $20 \log_{10}(1 \pm \delta_p) = \pm 0.1$ dB: Target $\omega_p = 0.042\pi$ rad;
Target $20 \log_{10}(\delta_s) = -60$ dB; Target $\omega_s = 0.14\pi$ rad;

In this section, an optimally-factored IFIR implementation is proposed and its complexity is compared with alternative designs in Mehrnia III, Aktan, Samueli, Lim III, Yao I, Yao II, Yu, Shi 1, Shi TI and Ye. Obtaining the optimum stretch factor (SF=3) for this 60-tap filter, via Mehrnia I, is shown in FIG. 9, and it leads to orders of 20 and 11 for the model filter G(z) and the interpolator filter I(z), respectively.

Figure 10:
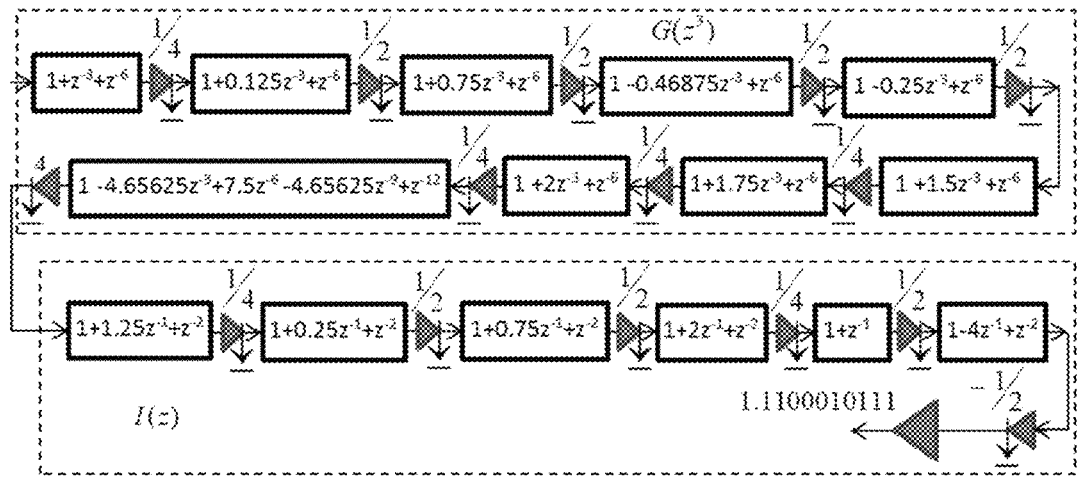
FIG. 10 depicts an exemplary optimally-factored IFIR implementation of 60-tap filter H(z) without joint sequencing.

The best identified optimal factors for G(z) and I(z) are found using the algorithm of Mehrnia III and they are shown in FIG. 10 as the optimally-factored IFIR implementation. A practical realization of this factored $G(z^3)I(z)$ cascade requires a careful choice of stage sequencing Mehrnia III in order to effectively manage the wordlength of the data path through the cascade stages. The stage sequencing in FIG. 10 uses individual sequencing of factors for $G(z^3)$ and I(z). This cascade requires a 14-bit data path (excluding the sign bit). The sequencing of stages for $G(z^3)$ and I(z) is also based on the method in Mehrnia III.

Figure 11:
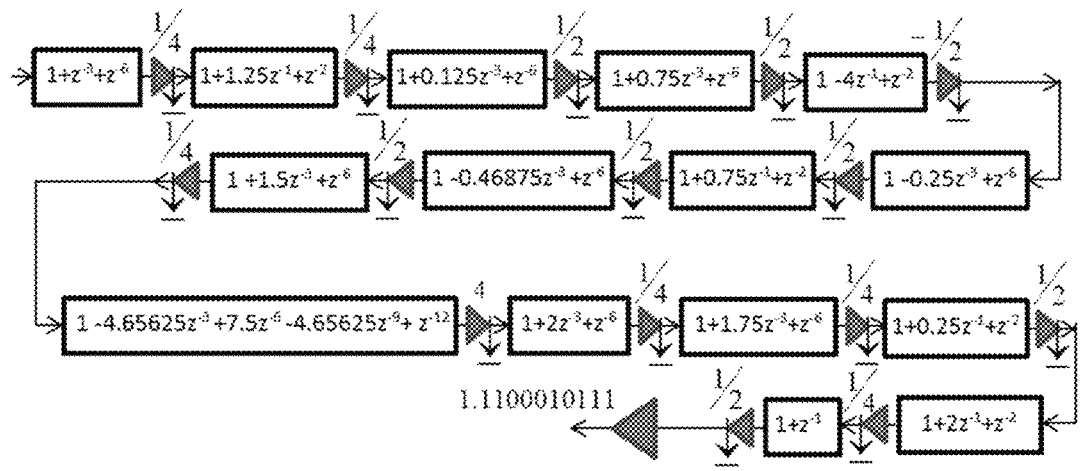
FIG. 11 depicts an exemplary joint sequencing of the stages to yield the optimally-factored IFIR implementation of the 60-tap filter H(z).

A better implementation of this cascade is shown in FIG. 11 based on the joint sequencing of the $G(z^3)$ and I(z) factors. Its data path requires only 13-bits (excluding the sign bit). This structure has only nine non-trivial coefficients, which are realizable with a total of ten shift-adds. There are 20 and 11 structural adders for $G(z^3)$ and I(z), respectively, in addition to the three shift-adds needed to implement the post-filter gain compensation multiplier, as shown in FIG. 11. If needed, the proposed structure has the flexibility to easily support pipelining through the insertion of registers between the stages (hence the name fully-pipelined optimally-factored interpolated FIR structure if a pipelining register is inserted between all adjacent stages).

Figure 12:
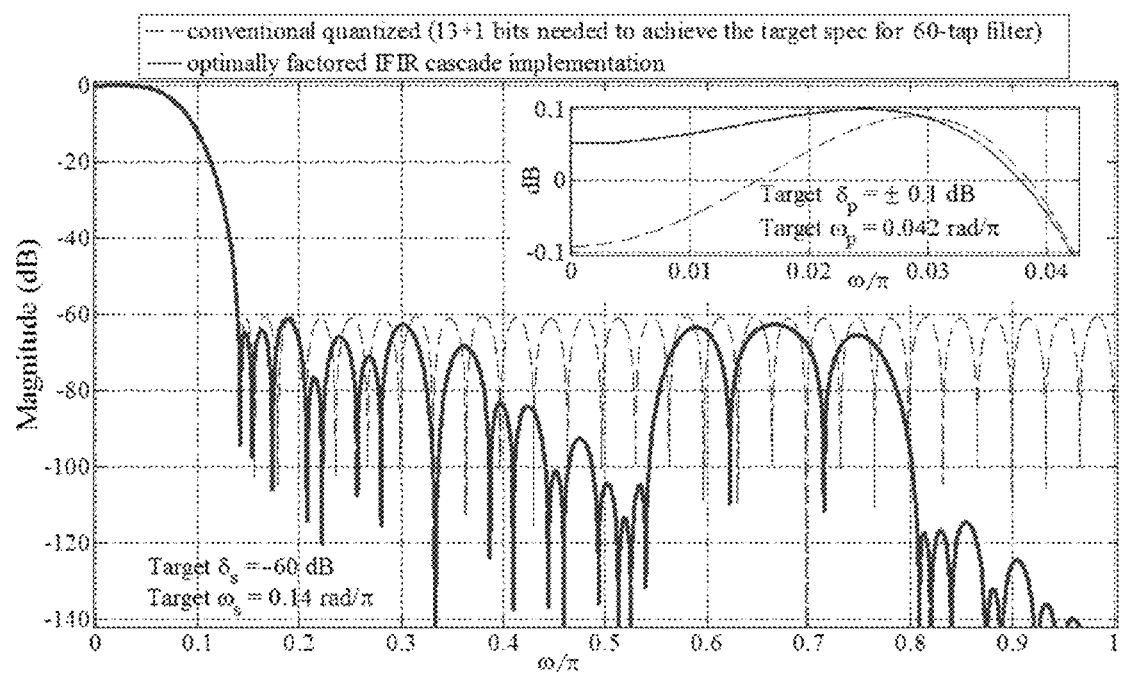
FIG. 12 depicts a magnitude plot of the exemplary optimally-factored IFIR (SF=3) filter (solid) vs. 60-tap conventional (dashed).
Figure 13:
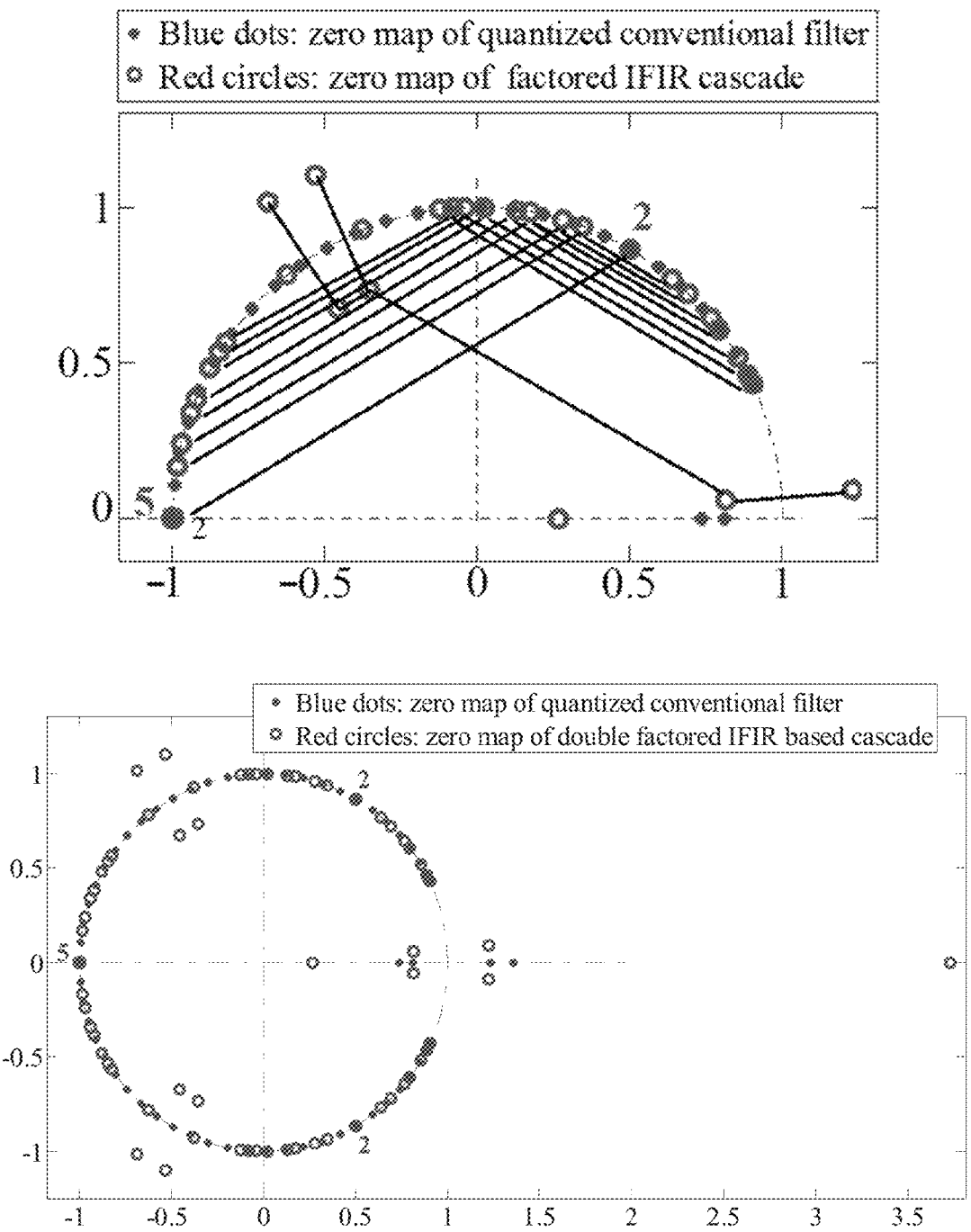
FIG. 13 depicts a zero map of the exemplary optimally-factored IFIR (circles) filter and 60-tap conventional filter (dots).

FIGS. 12 and 13 show the frequency response magnitude (in dB) and zero map for the resulting optimally-factored IFIR implementation of FIG. 11. The magnitude (dB) of the (SF=3) IFIR cascade (FIG. 12) demonstrates superior stopband characteristics compared to those of the conventional structure (the dashed line), particularly at mid and high frequencies. The zero-map of FIG. 13 illustrates the zero distribution (both full view and zoomed-in view) of the optimally-factored IFIR cascade versus that of the conventional (direct form) implementation. The lines indicate which zeros are paired to form each of the factors of the FIG. 11 structure.

Figure 14:
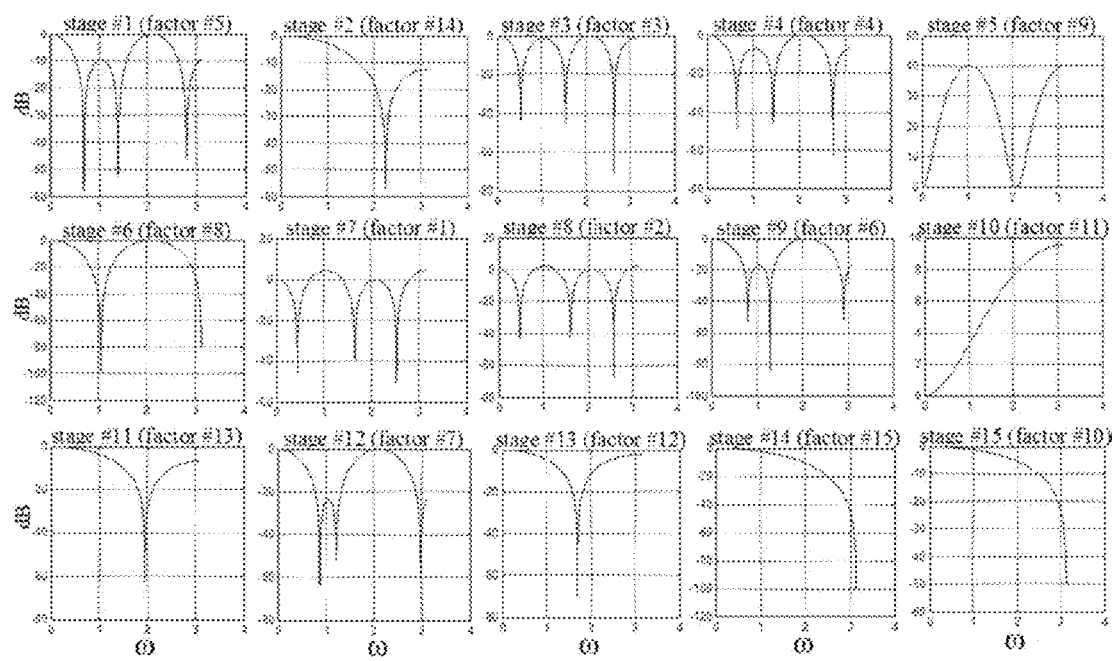
FIG. 14 depicts a magnitude plot of all 15 stages of an exemplary optimally-factored IFIR filter.

The magnitude responses of all 15 FIG. 11 stages are shown in FIG. 14, according to the exact sequence of stages in FIG. 11 suggested by the joint sequencing algorithm based on the method of Mehrnia III. To demonstrate the effectiveness of the stage sequencing as implemented in the optimally-factored IFIR filter of FIG. 11 one can perform the "four-test procedure" described in Mehrnia III. That is, the following four comprehensive tests (where the input signal RMS is $2^{N-1.5}$ in all cases with data path wordlength N=13, excluding the sign bit). One then measures the output RMS values of the signal at the output of all cascade stages. Notice that the choice of $2^{N-1.5}$ supports signal peak-to-average-power ratio (PAPR) of more than 9 dB which is sufficient for most practical applications. Nonetheless higher PAPR can also be supported simply by setting the RMS level of the input signal to the proper level (for instance $2^{N-2}$ supports 12 dB PAPR). If desired, the flexibility of the proposed structure also easily accommodates a non-uniform data path wordlength N across the stages of the cascade to deliver even better noise performance.

Figure 15:
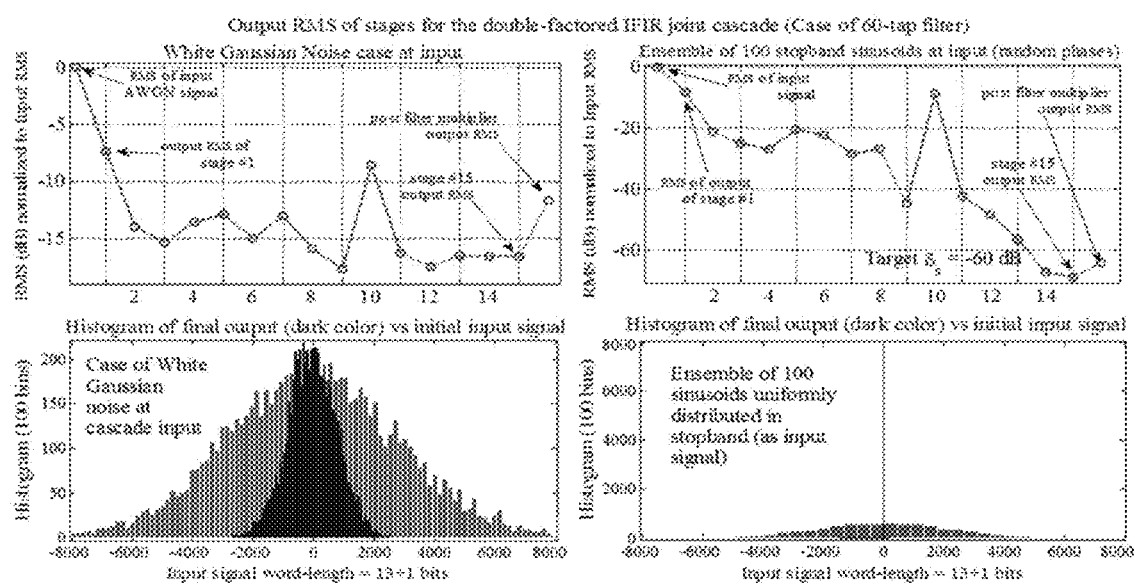
FIG. 15 depicts an RMS output of stages of an exemplary jointly-sequenced optimally-factored IFIR filter (Tests 1 and 2).
Figure 16:
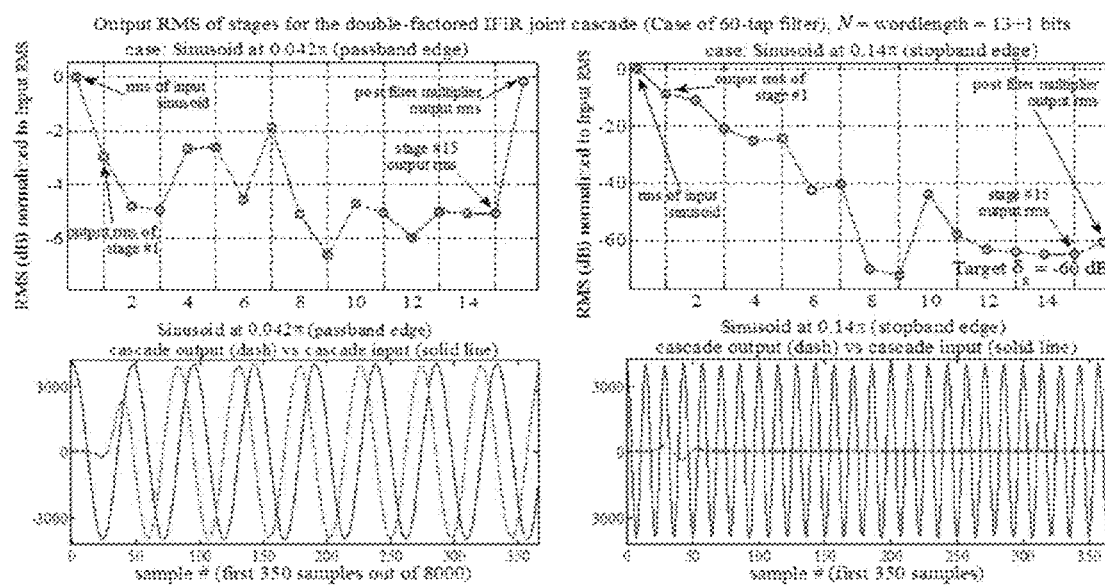
FIG. 16 depicts an RMS output of stages of the exemplary jointly-sequenced optimally-factored IFIR filter (Tests 3 and 4).

The chains of RMS values of the signal at the output of the optimally-factored IFIR cascade stages for these four tests are reported in FIG. 15 and FIG. 16 (8000 signal samples are used in each case).

Test 1) The input signal is white Gaussian noise (uniform power across all frequencies). One expects the filter to attenuate by 60 dB the portion of the signal within the stopband.

Test 2) The input signal is colored Gaussian noise with uniform power within the stopband. It is a sum of 100 random phase sinusoids uniformly distributed across the stopband. One expects a 60-dB attenuation of the entire signal.

Test 3) The input signal is one sinusoid at the passband edge.

Test 4) The input signal is one sinusoid at the stopband edge.

FIGS. 15 and 16 show that the optimally-factored IFIR filter with a 13+1-bit data path wordlength is able to fully attenuate (by at least 60 dB) the stopband portions of the input signal (including the sinusoid at the edge of the stopband) and it is able to perfectly pass the passband signals (including the sinusoid at the edge of the passband) with negligible (smaller than 0.1 dB) attenuation.

FIG. 16 shows the progress of the RMS stage outputs throughout the cascade for the two sinusoidal test cases at the edges of the passband and the stopband (Test 3 and Test 4). The time-domain output signals of the jointly-sequenced optimally-factored structure are also shown for both cases.

A summary and comparison to the alternative methods of implementing this filter are given in Table 2, which demonstrates that the optimally-factored IFIR filter of FIG. 11 has the lowest complexity. Parameter B is the data path wordlength which should be at least 11+1 bits (including the sign bit) for a single-stage conventional design to provide enough resolution to be able to observe the 60-dB attenuation of the incoming signal. For the optimally-factored interpolated FIR filter implementation, as discussed earlier, a wordlength of 13+1 bits is required. Table 2 also provides complexity comparisons of the FIRGAM method (see Aktan), the original CSD implementation of this example filter (see "Samueli") (which, being an early CSD filter, was focused on reducing adder costs), PMILP algorithm (see "Yao I and Yao II"), minimum adder MILP (see "Shi 1"), the cascade method (see "Shi II"), and the genetic algorithm cascade (see "Ye"). The optimally factored Interpolated FIR filter reduces the Remez benchmark cost the most, to 1764 if fully pipelined by inserting registers between all stages (or 1568 for the non-pipelined scenario).

stages. This advantage is always present when using optimally-factored FIR (and especially IFIR) filters and it can frequently be exploited for realizing additional design improvements.

IV. HARDWARE-EFFICIENT WIDEBAND FILTER DESIGN VIA OPTIMALLY-FACTORED IFIR IMPLEMENTATION: 121-TAP WIDEBAND EXAMPLE

Example 3

A 121-tap highpass wideband FIR filter H(z) is now considered with the following specifications:

TABLE 2

Hardware Complexity Comparison

| Hardware complexity for alternative filter design methods | MA | SA | Total # of Adders | Full Adders (FA) | D flip-flops (FF) | Total Complexity (FA + FF) |
|---|---|---|---|---|---|---|
| Modified optimally factored IFIR design Ripple = ±0.1225 dB $H(z) = G(z^3)I(z)$ | 9 | 31 | 40 | 560 (B = 13 + 1 bits) | 994 1190 for fully pipelined case | 1554 full pipelined: 1750 (B = 13 + 1 bits) |
| Optimally factored IFIR design Ripple = ±0.1 dB $H(z) = G(z^3)I(z)$ FIG. 11 (B = 13 + 1 bits) | 10 | 31 | 41 | 574 (B = 13 + 1 bits) | 994 1190 for fully pipelined case | 1568 full pipelined: 1764 (B = 13 + 1 bits) |
| Optimally factored Ripple = ±0.1 dB filter order = 59 [13] | 30 | 58 | 88 | 1270 (B = 13 + 1 bits) | 842 1128 for fully pipelined case | 2112 full pipelined: 2398 (B = 13 + 1 bits) |
| Genetic algorithm Two-stage cascade filter order = 60 [28] | 13 | 56 | 69 | Our estimate: >1500 (B = 12) | Our estimate: >1300 (B = 12) | Our estimate: >2800 (B = 11 + 1 bits) |
| Two-stage cascade filter order = 59 [27] | 14 | 55 | 69 | 697 + 69B = 1525 (B = 12) | Our estimate: >1300 (B = 12) | Our estimate: >2825 (B = 12) |
| MILP method[25, 26] filter order = 59 (according to [26]) | 19 | 59 | 78 | Our estimate: >1600 (B = 12) | Our estimate: >1350 (B = 12) | Our estimate: >2950 (B = 12) |
| Single-stage design filter order = 59 [26] | 17 | 59 | 76 | 729 + 76B = 1641 (B = 12) | Our estimate: >1350 (B = 12) | Our estimate: >2991 (B = 12) |
| FIRGAM [20] filter order = 59 | 27 | 59 | 86 | Our estimate: 1680 (B = 12) 1337 if B = 8 [20] | Our estimate: >1410 (B = 12) 1180 if B = 8 [20] | Our estimate: >3090 (B = 12) |
| PMILP [23-24], [20] filter order = 59 | 25 | 59 | 84 | Our estimate: 1678 (B = 12) 1342 if B = 8 [20] | Our estimate: >1490 (B = 12) 1255 if B = 8 [20] | Our estimate: >3168 (B = 12) |
| C5D [21], [20] filter order = 59 | 32 | 59 | 91 | Our estimate: 1819 (B = 12) 1455 if B = 8 [20] | Our estimate: >1500 (B = 12) 1298 if B = 8 [20] | Our estimate: >3319 (B = 12) |
| Remez [20] filter order = 59 Data wordlength = B bits | 32 | 59 | 91 | Our estimate: 1858 (B = 12) 1494 if B = 8 [20] | Our estimate: >1480 (B = 12) 1251 if B = 8 [20] | Our estimate: >3338 (B = 12) |

Additional Benefit of the Inherent Flexibility of the Optimally-Factored IFIR Filter Structure in FIG. 11.

If a (very modest) 0.0225-dB increase can be allowed in the passband ripple (i.e., changing from ±0.1 to ±0.1225 dB), then the $8^{th}$-stage $[1-0.46875z^{-3}+z^{-6}]$ in the FIG. 11 structure can be further simplified to become $[1-0.5z^{-3}+z^{-6}]$ while the rest of the cascade factors can remain intact. The resulting modified stage has only trivial coefficients, which yields a further reduction in the shift-add operations necessary for implementing the FIG. 11 filter (a reduction by 10%, from ten down to nine). The importance of this observation is that: In general, given any allowance in some of the target filter specifications, it is possible to exploit it to further simplify a specific stage (or stages!) of the optimally-factored IFIR filter, in particular without the need to change any of the other Target 20 $\log_{10}(1\pm\delta_p)=\pm0.05$ dB: Target $\omega_p=0.8\pi$ rad;
Target 20 $\log_{10}(\delta_s)=-80$ dB; Target $\omega_s=0.74\pi$ rad;

Similar to the narrowband case (Example 2), this order-120 filter is a good example because several previous publications have chosen to use this filter when presenting their own filter design methods. This filter, referred to as filter L1, was examined in Aktan where the FIRGAM algorithm is introduced and employed. The FIRGAM implementation was compared to three other implementations including: the Remez algorithm (RMZ), an algorithm (LIM) from Lim III, and a Partial Mixed-Integer Linear Programming (PMILP) algorithm of Yao I and Yao II. All such implementations used an optimized transposed direct-form structure and the performance of the FIRGAM filter appeared superior to the other designs as summarized in Table V of Aktan.

The use of this optimal factoring algorithm for this 121-tap filter has been investigated and it revealed a structure that appears to surpass all the others: an optimally-factored interpolated FIR implementation. The complexity of the proposed structure will be compared with the previous designs. Notice that this filter has 120 zeros. An exhaustive pairing and factoring of all zero-pairs would, of course, be impractical since there are more than $10^{30}$ possible factoring choices Mehrnia III, a number so large as to make the task impossible, not even considering that for each pairing possibility the corresponding cascade filter would have to be configured and then the lowest level of required coefficient quantization for each resulting factor would need to be determined under the constraint that the overall cascade has to satisfy the target filter specification. Employing this optimally-factored IFIR structure, the result was found in approximately one minute of computing time, using the same Samsung Series 9 Ultra-book referred to in Mehrnia III.

Figure 17:
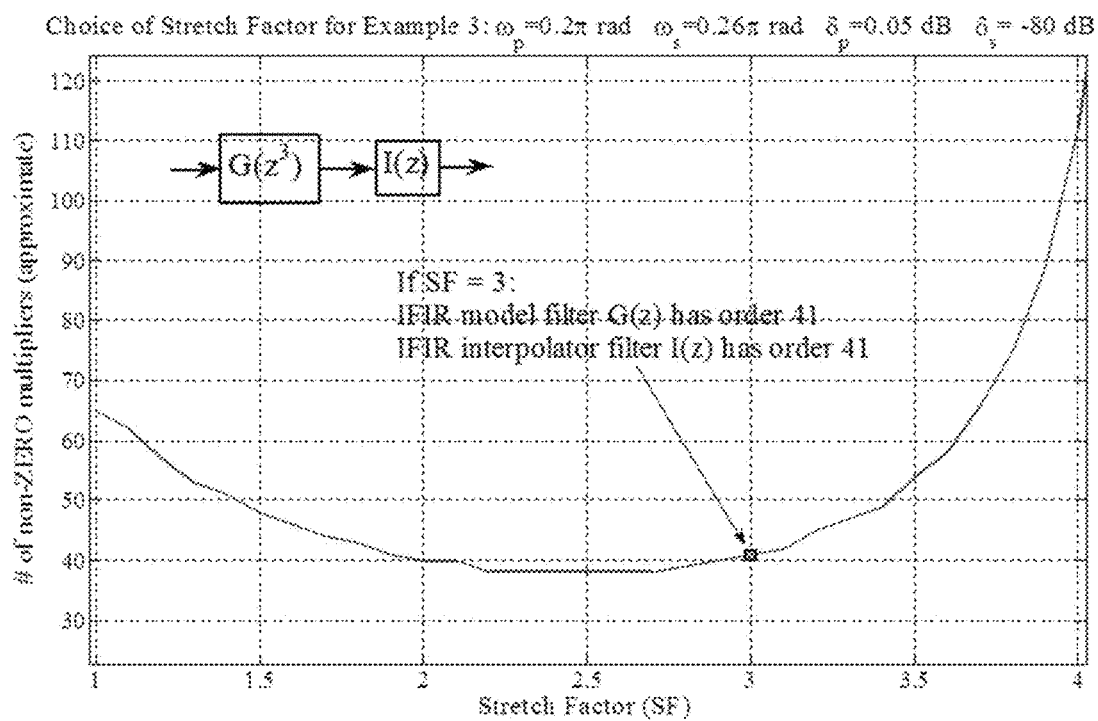
FIG. 17 depicts an exemplary choice of optimum stretch factor for 121-tap filter (Example 3).

The lowpass version of this filter has the following spec.
Target $20\log_{10}(1\pm\delta_p)=\pm0.05$ dB: Target $\omega_p=0.02\pi$ rad;
Target $20\log_{10}(\delta_s)=-80$ dB; Target $\omega_s=0.26\pi$ rad;

Of course, once this filter is designed, it can be convened to the desired highpass version by using the simple $z^{-1} \rightarrow -z^{-1}$ transformation. Finding the optimum stretch factor (Mehrnia I) for this 121-tap lowpass filter is illustrated in FIG. 17, which specifies an order of 41 for both the model filter G(z) and the interpolator (masking) filter I(z), when using the optimum stretch factor SF=3 where:

$$H(z)=G(z^3)I(z).$$

The best identified optimally-factored FIR implementations of G(z) and I(z) are found using the algorithm of Mehrnia III.

Figure 18:
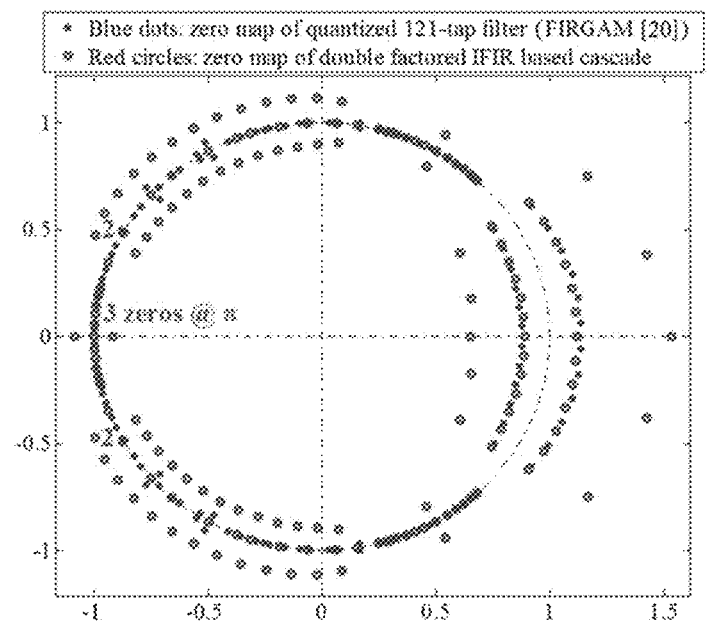
FIG. 18 depicts a zero map of the lowpass version, of the exemplary optimally-factored IFIR (circles) versus 121-tap (dots) filter.
Figure 18:
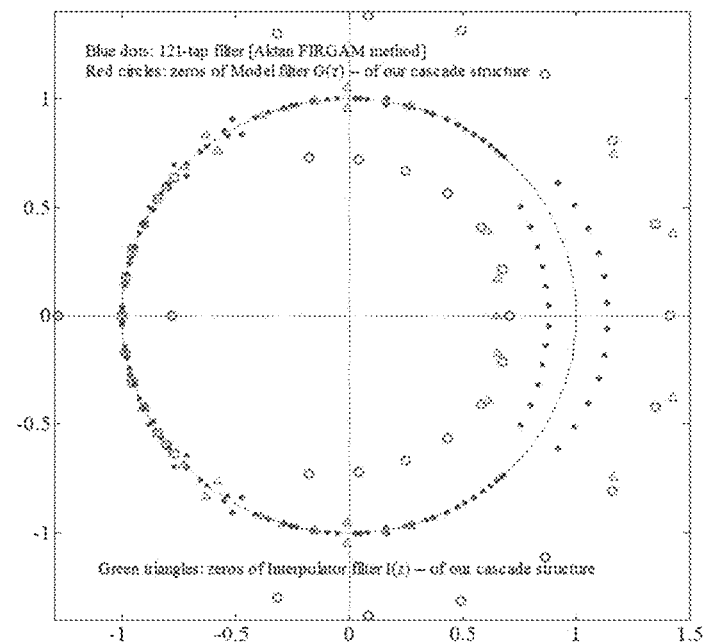

The zero map of FIG. 18 illustrates the zero distribution of the optimally-factored IFIR vs. that of the conventional implementation (see Aktan). The rightmost zero plot highlights the zero distributions of G(z) and I(z) using circles and triangles, respectively. Table 3, for 13 stages of the model filter G(z), and Table 4, for 15 stages of the masking filter I(z), provide the transfer functions of the quantized stages (and the binary and also the SPT representations of the corresponding non-trivial stage coefficients.)

TABLE 3

Model Filter

| Quantized 13 Stages | Binary for nontrivial coeffs. | SPT representation for nontrivial coefficients |
|---|---|---|
| 1: $(1+z^{-4})+0.990234375\,(z^{-1}+z^{-3})+2.572265625z^{-2}$ | [0.111111011 10.100100101] | $[2^0-2^{-7}-2^{-9}\,(2^1+2^{-1})\,(1+2^{-8})+2^{-4}]$ |
| 2: $(1+z^{-4})-0.25\,(z^{-1}+z^{-3})+2.453125z^{-2}$ | [-0.01 10.011101] | $[-2^{-2}\,2^1+2^{-1}-2^{-4}+2^{-6}]$ |
| 3: $(1+z^{-4})-0.21875\,(z^{-1}+z^{-3})-2.03125z^{-2}$ | [-0.00111 -10.00001] | $[-2^{-2}+2^{-5}-2^1-2^{-5}]$ |
| 4: $1+1.546875z^{-1}+z^{-2}$ | 1.100011 | $(2^0+2^{-1})\,(1+2^{-5})$ |
| 5: $(1+z^{-4})-2.59375\,(z^{-1}+z^{-3})+3.984375z^{-2}$ | [-10.10011 11.111111] | $[-2^1-2^1-2^{-4}-2^{-5}\,2^2-2^{-6}]$ |
| 6: $1+1.609375z^{-1}+z^{-2}$ | 1.100111 | $2^0+2^{-1}+2^{-3}-2^{-6}$ |
| 7: $(1+z^{-4})-3.48046875\,(z^{-1}+z^{-3})+5.1875z^{-2}$ | [-11.01111011 101.0011] | $[-2^2+2^{-1}+2^{-6}+2^{-8}\,2^2+2^0+2^{-3}+2^{-4}]$ |
| 8: $1+1.8125z^{-1}+z^{-2}$ | 1.1101 | $2^1-2^{-2}+2^{-4}$ |
| 9: $1+1.6875z^{-1}+z^{-2}$ | 1.1011 | $2^1-2^{-2}-2^{-4}$ |
| 10: $(1+z^{-4})-1.484375\,(z^{-1}+z^{-3})+2.96875z^{-2}$ | [-1.011111 10.11111] | $(2^1-2^{-1}-2^{-6})\,[-1\;2]$ |
| 11: $1+2.0625z^{-1}+z^{-2}$ | 10.0001 | $2^1+2^{-4}$ |
| 12: $(1+z^{-6})-2.078125(z^{-1}+z^{-5})-0.828125\,(z^{-2}+z^{-4})+3.9921875z^{-3}$ | [-10.000101 -0.110101 11.1111111] | $[-2^1-2^{-4}-2^{-6}-2^{-1}-2^{-2}-2^{-4}-2^{-6}\,2^2-2^{-7}]=[-2^1-2^{-1}-2^{-2}\,2^2-2^{-7}]-(2^{-4}+2^{-6})[1\;1\;0]$ |
| 13: $1+z^{-1}$ | none | none |

TABLE 4

Interpolator Filter

| Quantized 15 Stages | Binary for nontrivial coeffs. | SPT representation for nontrivial coefficients |
|---|---|---|
| 14: $(1+z^{-4})+(z^{-1}+z^{-3})+1.25z^{-2}$ | 1.01 | $2^0+2^{-2}$ |
| 15: $(1+z^{-4})+0.75(z^{-1}+z^{-3})+1.25z^{-2}$ | [0.11 1.01] | $[2^{-1}+2^{-2}\,2^0+2^{-2}]$ |
| 16: $(1+z^{-4})+1.984375z^{-2}$ | 1.111111 | $2^1-2^{-6}$ |
| 17: $1-0.3125z^{-1}+z^{-2}$ | -0.0101 | $-2^{-2}-2^{-4}$ |
| 18: $1+1.75z^{-1}+z^{-2}$ | 1.11 | $2^1-2^{-2}$ |
| 19: $1+1.875z^{-1}+z^{-2}$ | 1.111 | $2^1-2^{-3}$ |
| 20: $1+0.375z^{-1}+z^{-2}$ | 0.011 | $2^{-2}+2^{-3}$ |
| 21: $1+0.625z^{-1}+z^{-2}$ | 0.101 | $2^{-1}+2^{-3}$ |
| 22: $(1+z^{-4})-3.546875(z^{-1}+z^{-3})+5.2734375z^{-2}$ | [-11.100011 101.0100011] | $(2^2-2^{-1}+2^{-5}+2^{-6})[-1\;2^{-1}]+[0\;2^2-2^{-1}]$ |
| 23: $1+2z^{-1}+z^{-2}$ | 10.0 | $2^1$ |
| 24: $1+0.75z^{-1}+z^{-2}$ | 0.11 | $2^{-1}+2^{-2}$ |
| 25: $1+z^{-1}+z^{-2}$ | none | none |
| 26: $1-2.1875z^{-1}+z^{-2}$ | -10.0011 | $-2^1-2^{-3}-2^{-4}$ |

TABLE 4-continued

Interpolator Filter

| Quantized 15 Stages | Binary for nontrivial coeffs. | SPT representation for nontrivial coefficients |
|---|---|---|
| 27: $(1 + z^{-6}) - 2.41015625(z^{-1} + z^{-5}) + 0.08984375(z^{-2} + z^{-4}) + 2.82421875z^{-3}$ | [−10.01101001 0.00010111 10.11010011] | $[-((2^1 + 2^{-2})(1 + 2^{-6}) + 2^{-3})$ $2^{-4} + 2^{-5} - 2^{-8} +$ $(2^1 + 1)(1 - 2^{-4} + 2^{-8})]$ |
| 28: $1 + z^{-1}$ | none | none |

To further illustrate the benefits of zero-pairing (fusing factors), notice the $6^{th}$-order (largest order) factor for the model filter G(z), as shown in Table 3, that corresponds to the following 18 s-order factor for $G(z^3)$:
$(1+z^{-18}) - 2.078125 \quad (z^{-3}+z^{-15}) - 0.828125 \quad (z^{-6}+z^{-12}) + 3.9921875z^{-9}$.

This factor is obtained by fusing the $2^{nd}$-order factor $(1+1.96875z^{-1}+z^{-2})$, corresponding to the ±169.86° unit-circle conjugate pair, with the $4^{th}$-order factor comprised of the off-the-unit-circle "reciprocal and conjugate" pairs:
$(1-4.046596431799835z^{-1}+6.1383475542300475z^{-2}- 4.046596431799835z^{-3}+z^{-4})$, corresponding to ±17.43°.

Comparing coefficients of the factors before and after pairing, it is clear that the optimally-factored IFIR design benefits in terms of both stage taming and reducing the number of required shift-adds for the G(z) multipliers.

Similarly, notice the $6^{th}$-order (largest order) factor for the masking filter I(z), as shown in Table 4:
$(1+z^{-6})-2.41015625(z^{-1}+z^{-5})+0.08984375(z^{-2}+z^{-4})+ 2.82421875z^{-3}$.

This factor is obtained by fusing the $2^{nd}$-order factor $(1+1.75z^{-1}+z^{-2})$, corresponding to the ±151.04° unit-circle conjugate pair, with the following $4^{th}$-order factor:
$(1-4.1597031438625225z^{-1}+6.367886771835650z^{-2}- 4.1597031438625225z^{-3}+z^{-4})$,
corresponding to the ±14.94° off-the-unit-circle reciprocal and conjugate zero pairs resulting in reduced complexity for I(z).

The binary value and SPT representations of the coefficients for both G(z) and I(z) are also listed in Tables 3 and 4, which indicate that 37 shift-adds and 24 shift-adds are needed to implement all the required multipliers for the G(z) and I(z) coefficients, respectively. It is known that 41 structural adders are needed to realize the degree-41 G(z), and Table 4 shows that the degree-41 I(z) needs only 39 structural adders. Therefore, as summarized in Table 5, a total of 61 Multiplier Adders (MA) and a total of 80 Structural Adders (SA) are needed to realize the optimally-factored interpolated structure.

Figure 19:
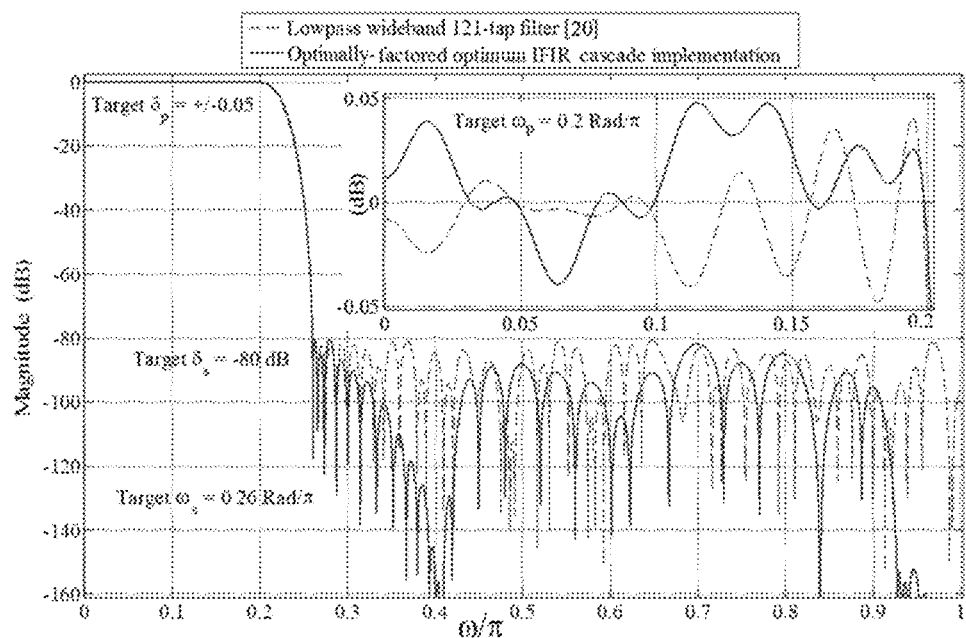
FIG. 19 depicts a magnitude plot of the exemplary optimally-factored IFIR (SF=3) filter (solid) versus 121-tap (dash).

FIG. 19 shows the magnitude response (in dB) for the optimally-factored IFIR filter (lowpass version). Its stopband behavior exceeds the target specification, especially at mid and high frequencies. Its peak-to-peak passband ripple is 0.0872 dB.

A practical realization of the factored $G(z^3)I(z)$ cascade requires a careful choice of stage sequencing (see Mehrnia III) to effectively manage the wordlength of the data path through the cascade stages. The feasibility of both individual sequencing and joint sequencing of the $G(z^3)$ stages and the I(z) stages has been investigated. The outcomes of both sequencing approaches are presented here. Given the target stopband attenuation of 80-dB and M=28 stages (Tables 3 and 4), and using a target peak-to-average-power-ratio margin of 1.5 bits, the signal-path wordlength (N), excluding the sign bit, should be at least 17 bits. Interestingly, the individual sequencing approach can also accommodate different choices of wordlength for the $G(z^3)$ and I(z) sub-cascades—e.g., a 17-bit data path (excluding sign bit) for $G(z^3)$ and, depending on target application, possibly a 16-bit data path for I(z).

Approach #1: Individual Sequencing of $G(z^3)$ & I(z) Stages.

Figure 20:
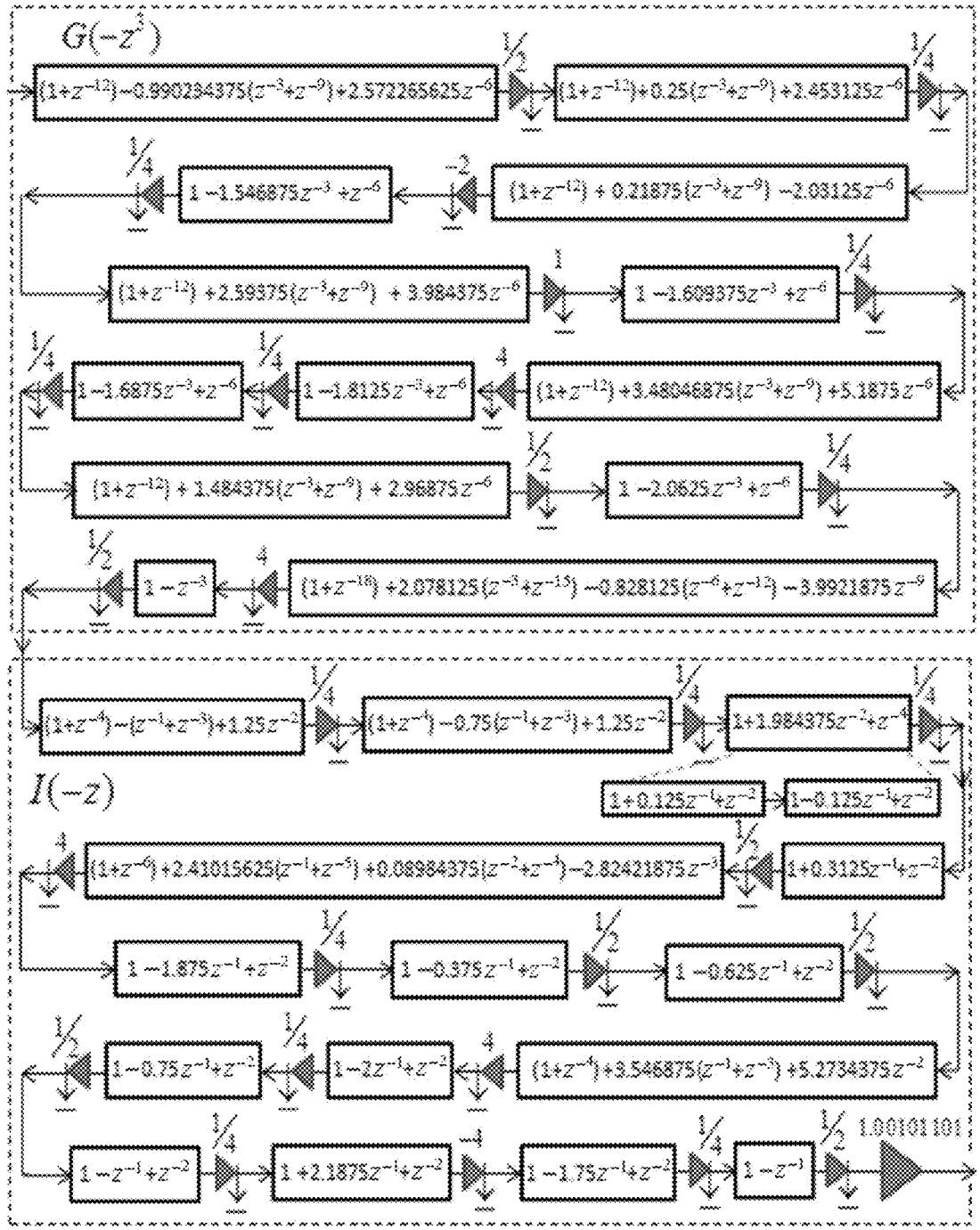
FIG. 20 depicts an exemplary optimally-factored IFIR implementation of 121-tap highpass filter H(z)—without joint sequencing.

The stage sequencing as listed in Tables 3 and 4 is based on the individual sequencing (see Mehrnia III) of factors for $G(z^3)$ and for I(z) or their highpass versions $G(-z^3)$ and I(−z), which are shown in FIG. 20 as the individually sequenced optimally-factored IFIR (highpass filter). A comparison with the previously disclosed methods of implementing this 121-tap filter is given in Table 5, and it is evident that the optimally-factored IFIR has the lowest complexity. The signal wordlength B should be at least 14+1 bits (including sign-bit) for the conventional single-stage design to provide enough resolution to be able to observe a stopband attenuation of 80 dB.

TABLE 5

Hardware Complexity Summary and Comparison

Figure 24:
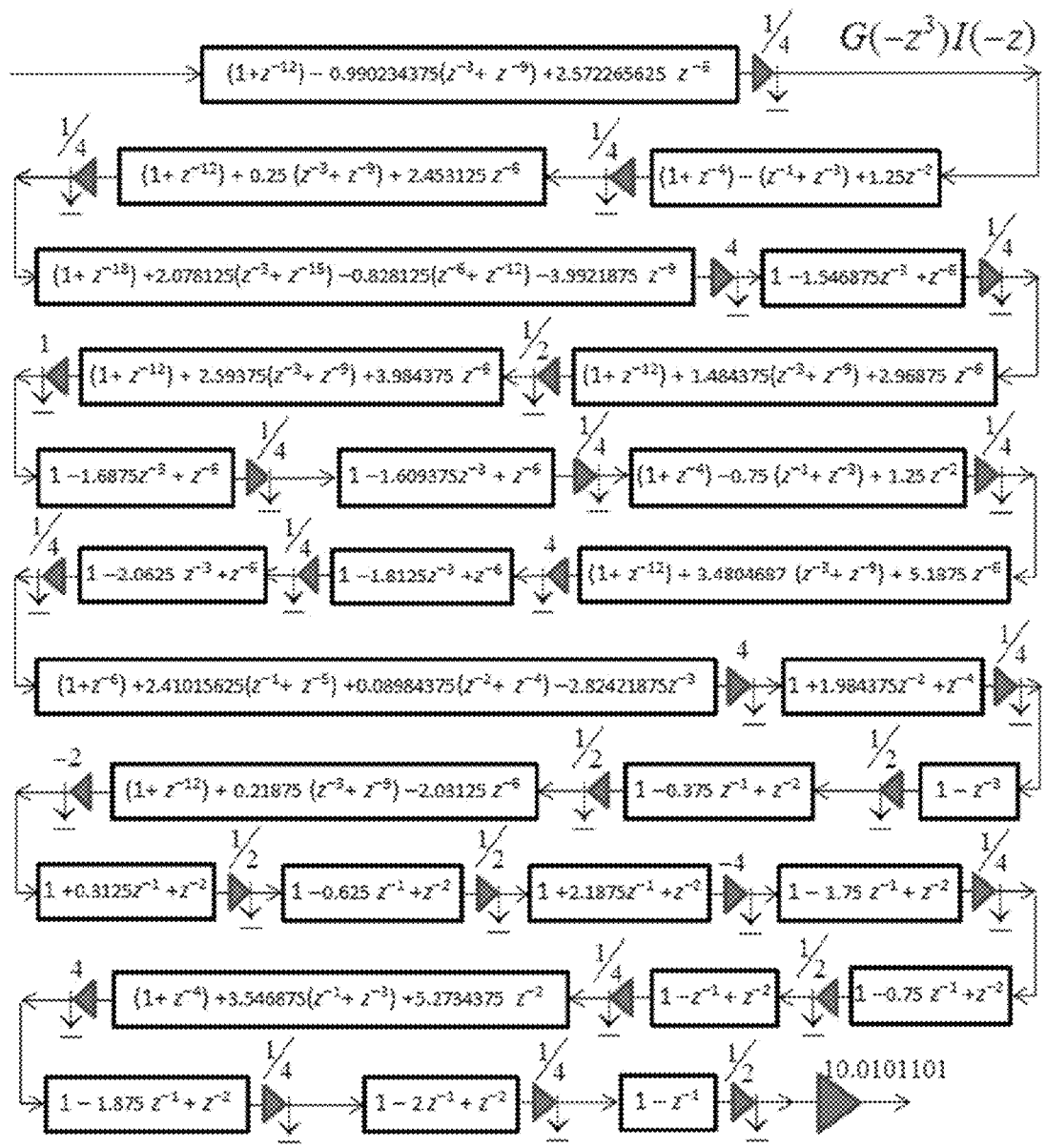
FIG. 24 depicts an exemplary optimally-factored IFIR implementation of 121-tap highpass filter—with joint sequencing.

| Hardware complexity for alternative filter design methods | MA | SA | Total s# of Adders | Full Adders (FA) | D flip-flops (FF) | Total Complexity (FA + FF) |
|---|---|---|---|---|---|---|
| Optimally factored IFIR design $H(z) = G(-z^3)I(-z)$ FIG. 24 (B = 17 + 1 bits) | 61 | 80 | 141 | 2578 (B = 17 + 1 bits) | 2952 3441 for fully pipelined case | 5530 full pipelined: 6019 (B = 17 + 1 bits) |
| FIRGAM [20] filter L1 | 47 | 120 | 167 | Our estimate: 4055 (B = 15) 2886 if B = 8 [20] | Our estimate: >3494 (B = 15) 2654 if B = 8 [20] | Our estimate: >7549 (B = 15) |
| LMS algorithm [22] filter L1 (LIM method in [20]) | 61 | 120 | 181 | Our estimate: 4413 (B = 15) 3146 if B = 8 [20] | Our estimate: >3504 (B = 15) 2664 if B = 8 [20] | Our estimate: >7917 (B = 15) |

TABLE 5-continued

Hardware Complexity Summary and Comparison

| Hardware complexity for alternative filter design methods | MA | SA | Total s# of Adders | Full Adders (FA) | D flip-flops (FF) | Total Complexity (FA + FF) |
|---|---|---|---|---|---|---|
| PMILP [23-24], [20] filter L1 | 59 | 120 | 179 | Our estimate: 4501 (B = 15) 3248 if B = 8 [20] | Our estimate: >3588 (B = 15) 2748 if B = 8 [20] | Our estimate: >8089 (B = 15) |
| Remez [20] filter L1 Data wordlength = B bits | 78 | 120 | 198 | Our estimate: 5033 (B = 15) 3647 if B = 8 [20] | Our estimate: >3747 (B = 15) 2907 if B = 8 [20] | Our estimate: >8780 (B = 15) |

To examine the effectiveness of the stage sequencing as implemented in the individually sequenced optimally-factored IFIR cascade of FIG. 20, one can perform the previously-mentioned Four-Test procedure with the input signal RMS set at $2^{N-1.5}$ in all cases, where N=17 is the wordlength, excluding sign-bit, of the data-path through the $G(-z^3)$ and $I(-z)$ cascades. (The 60 dB mentioned in Test 1 and Test 2 of the procedure for Example 2 now becomes 80 dB for Example 3.) One then measures the output RMS values of all cascade stages of the optimally-factored IFIR implementation of the 121-tap highpass filter H(z) in FIG. 20. The chains of RMS values for these four tests are reported in FIGS. 21 and 22 (10,000 signal samples are used in each case).

Figure 21:
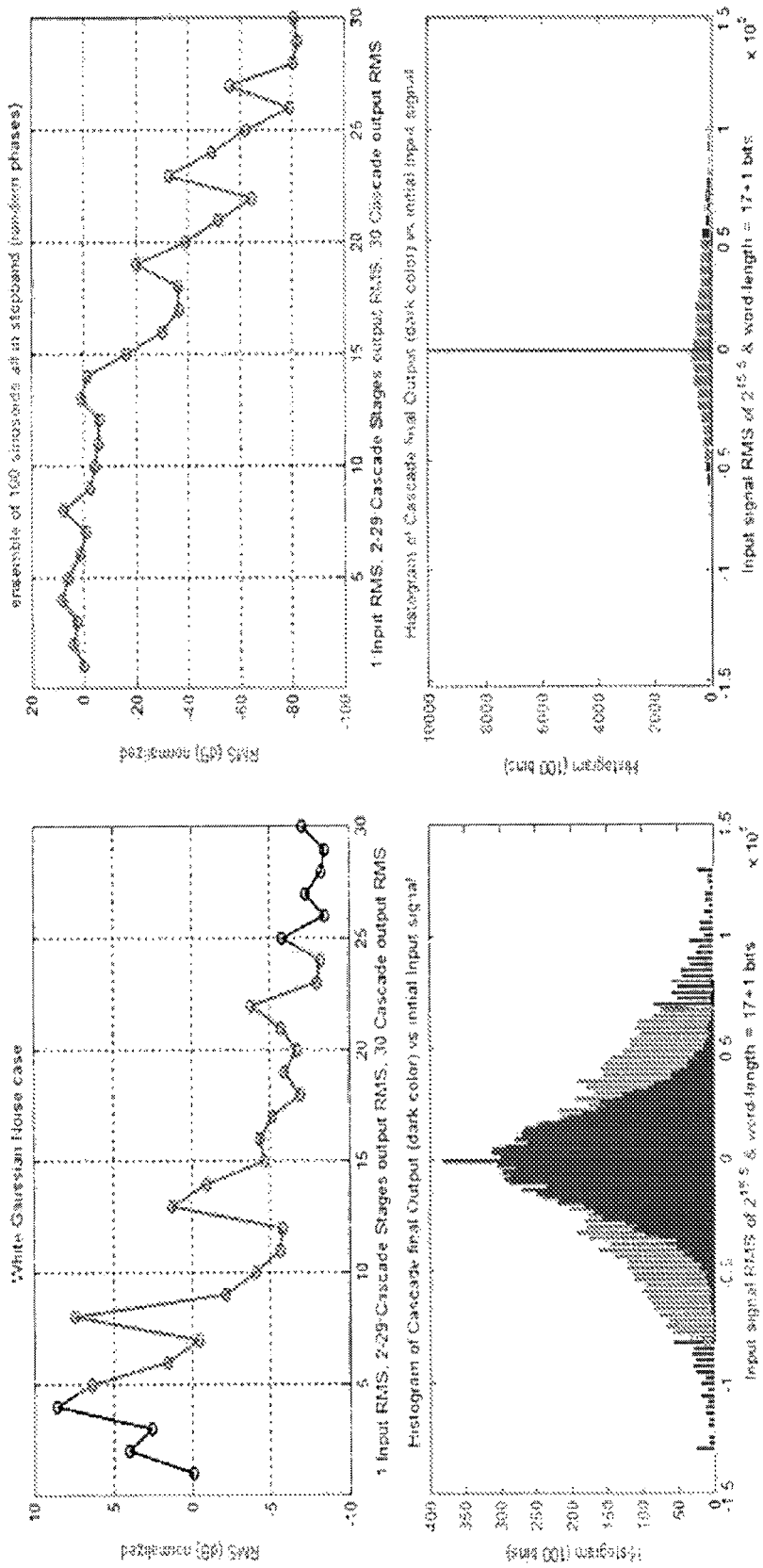
FIG. 21 depicts an RMS output of stages of the exemplary individually-sequenced optimally-factored IFIR filter (Tests 1 and 2).
Figure 22:
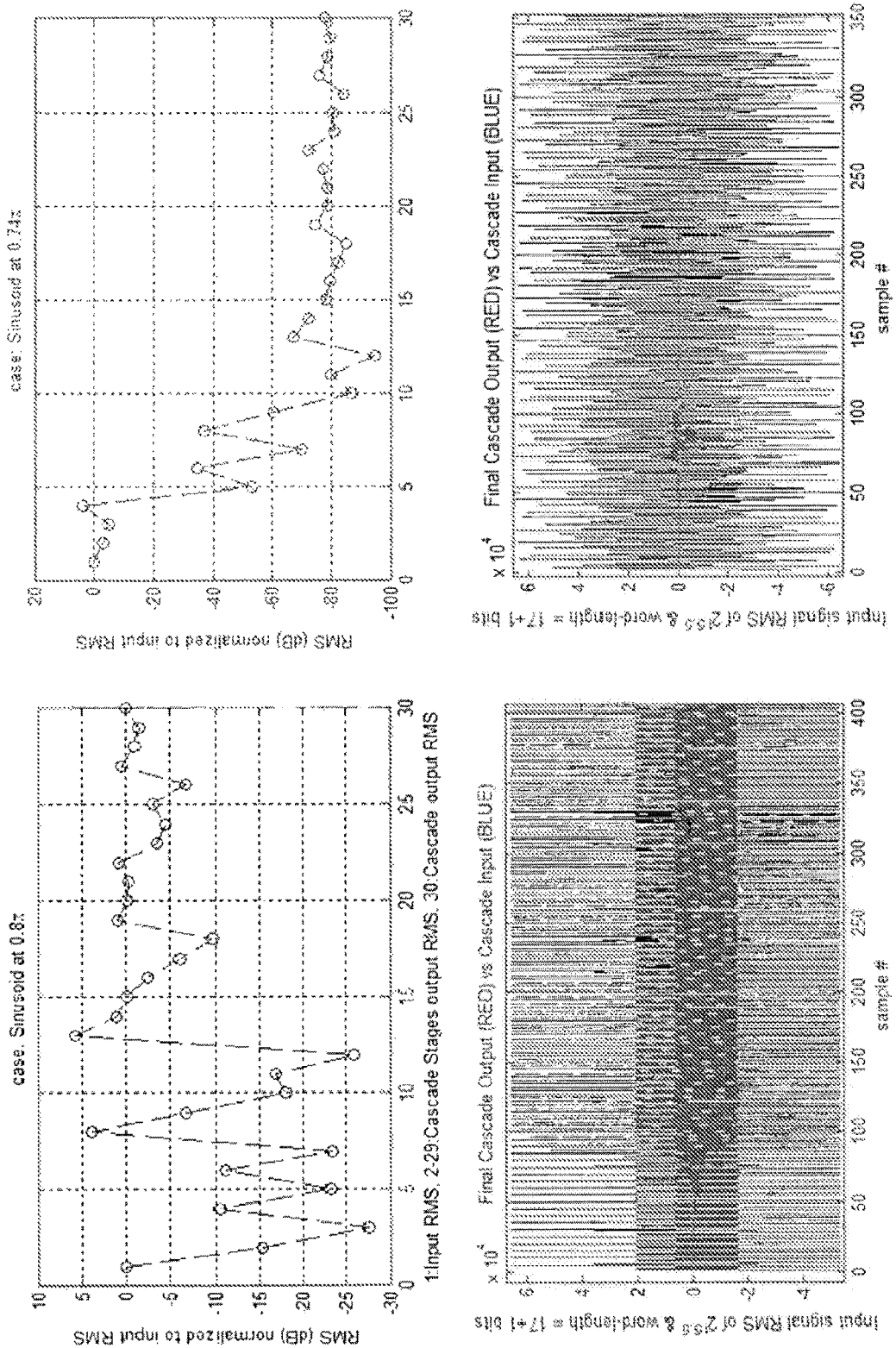
FIG. 22 depicts an RMS output of stages of the exemplary individually-sequenced optimally-factored IFIR filter (Tests 3 and 4).

FIGS. 21 and 22 show that the individually sequenced optimally-factored IFIR filter (FIG. 20) with a 17+1-bit datapath wordlength is able to attenuate (by 80 dB) the stopband portion of the input signal (including a sinusoid at the edge of the stopband) and it is able to perfectly pass the passband signals (including a sinusoid at the edge of the passband) with negligible (smaller than 0.05-dB) attenuation.

FIG. 21 shows the RMS of outputs of all stages for both $G(-z^3)$ and $I(-z)$ for Tests 1 and 2. FIG. 22 shows the progress of the RMS stage outputs through the cascade for the two sinusoidal test cases (Tests 3 and 4). While I(z) stages demonstrate perfect RMS behavior, $G(z^3)$ stages 3, 7, and 12 require minor taming, depending on the target PAPR requirements, to reduce output RMS increases. The flexibility of the optimally-factored structure enables a variety of options for stage taming as is briefly discussed in Mehrnia III and as has been demonstrated above in generating the $6^{th}$-order stage for G(z).

Another possible taming approach consists of inserting an external "taming factor" into the cascade and fusing it with the aggressive stage under the condition that this would not violate the target overall filter spec. An example of this was presented in Mehrnia HIII where the insertion of a $1+z^{-1}$ factor reduced the number of required shift-adds for a narrowband lowpass 16-tap filter [$\omega_p$=0.042π, 20 $\log_{10}(1\pm\delta)$=±0.7 dB] at the expense of an increase (by one) in the number of required registers. For the 121-tap filter of this example, one is not able to employ an external $1+z^{-1}$ taming factor due the wideband nature of the filter and its very demanding passband ripple requirement, 20 $\log_{10}(1\pm\delta_p)$=±0.05 dB.

Figure 23:
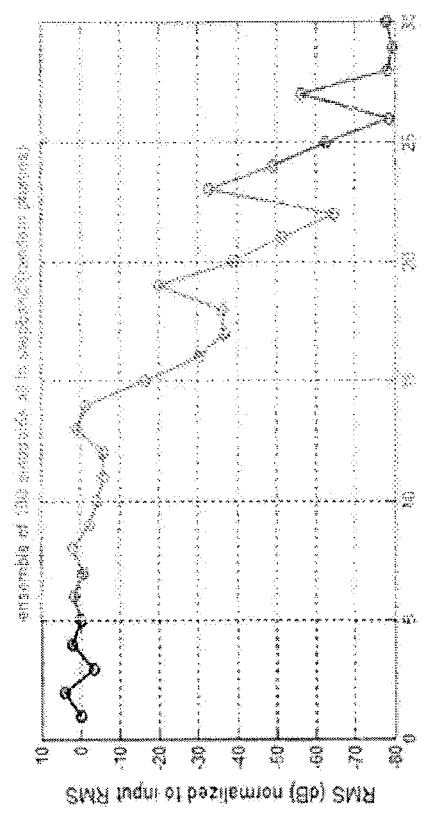
FIG. 23 depicts an RMS output of exemplary stages (121-tap filter) for Tests 1 and 2 (rearranged stage shifters via Table 6).
Figure 23:
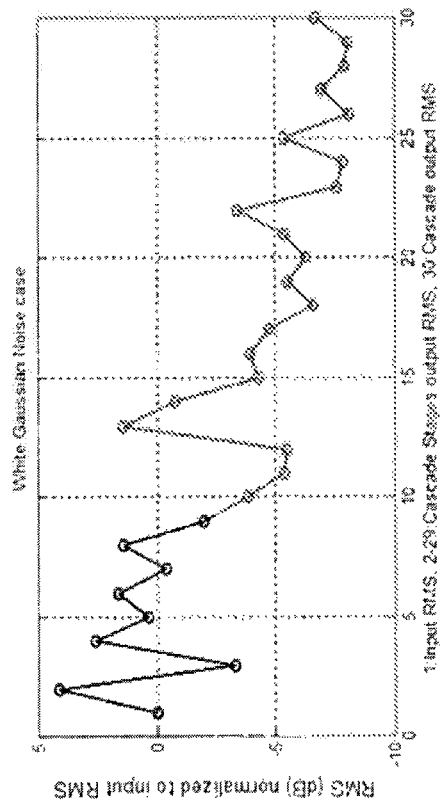

Nonetheless, the inherent flexibility of this structure does permit a somewhat more complicated taming method: a rearrangement of the post-stage power-of-two multipliers (stage shifters) to defer (or expedite) a specific signal-RMS increase through the cascade. It is not recommended that this approach be used as a routine measure since, while it can help to reduce RMS increases throughout the cascade, it might result in a slight noise-performance deterioration in the stopband (targeted signal-attenuation) at the final output. The following stage-shifter rearrangement-example for four of $G(-z^3)$ stages shows the potentials as well as drawbacks. In an attempt to reduce the signal RMS (FIG. 21) at the outputs of Stage 3, 7 and 12, the rearrangements of Table 6 have been performed. This resulted in the stage output RMS values shown in FIG. 23, which describe the modified version of the FIG. 21 results. The Table 6 rearrangements cause FIG. 23 to show a considerably more tamed behavior, with a maximum RMS value of 4.1 dB compared to the original RMS maximum of 8.5 dB in FIG. 21. This improvement comes at the expense of the final cascade RMS value of −78 dB (instead of the targeted −80 dB) for Test #2, shown to the right in FIG. 23—the stopband deterioration (drawback) to which reference is made.

TABLE 6

Rearrangement of Stage Shifters

| | Post-stage shifter (as in FIG. 20) | Post-stage shifter (after rearrangment) |
|---|---|---|
| $G(-z^3)$ Stage #1 | 0.5 | 0.5 |
| $G(-z^3)$ Stage #2 | 0.25 | 0.125 |
| $G(-z^3)$ Stage #3 | −2.0 | −2.0 |
| $G(-z^3)$ Stage #4 | 0.25 | 0.25 |
| $G(-z^3)$ Stage #5 | 1.0 | 2.0 |
| $G(-z^3)$ Stage #6 | 0.25 | 0.25 |
| $G(-z^3)$ Stage #7 | 4.0 | 2.0 |
| $G(-z^3)$ Stage #8 | 0.25 | 0.5 |

A final stage-management method is now discussed, one that can be viewed as a tool the designer can use when no further stage taming seems achievable. This method expands the wordlength at the output of those stages which excessively amplify RMS. While, for implementation simplicity, the preferred cascade structure is one with uniform wordlength throughout the $G(-z^3)$ block (e.g., the 17+1 bits, as presented earlier), the structure would allow an increase in the word length to, say, 18+1 bits for stages 3, 7 and 12 and potentially for the immediately succeeding stages to accommodate a stage-specific increased output RMS value (FIG. 21) for those stages. Given the simplicity of these small-order stages, this can be done by simply extending a few adders and registers by one extra bit and then returning to 17+1 bits in the following stages which do not require such extra RMS accommodations.

Approach #2: Joint Sequencing of $G(-z^3)$ and $I(-z)$ Stages.

Figure 25:
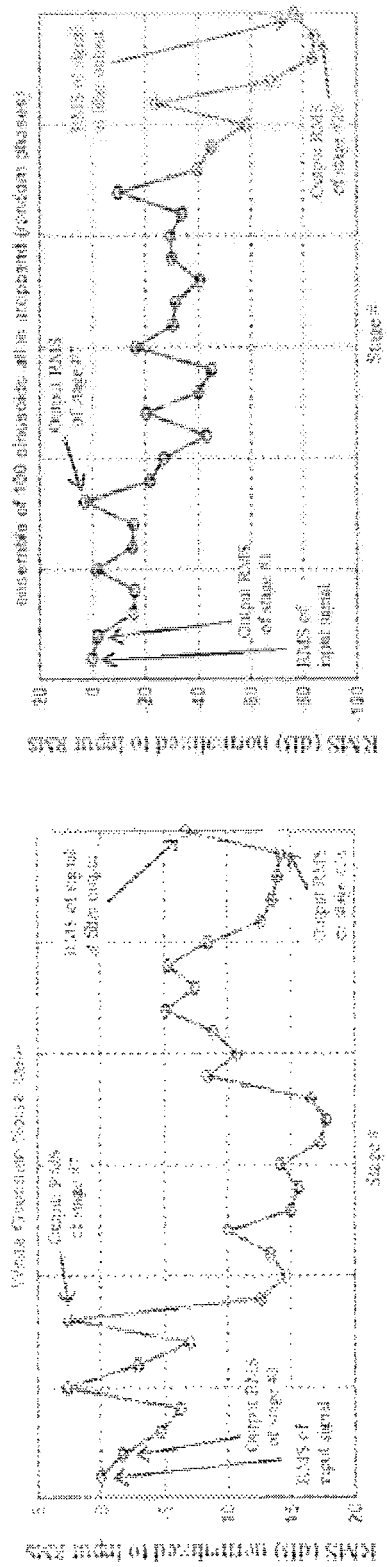
FIG. 25 depicts an RMS output of stages of the exemplary jointly-sequenced optimally-factored IFIR filter in FIG. 24 (Tests 1 and 2).
Figure 26:
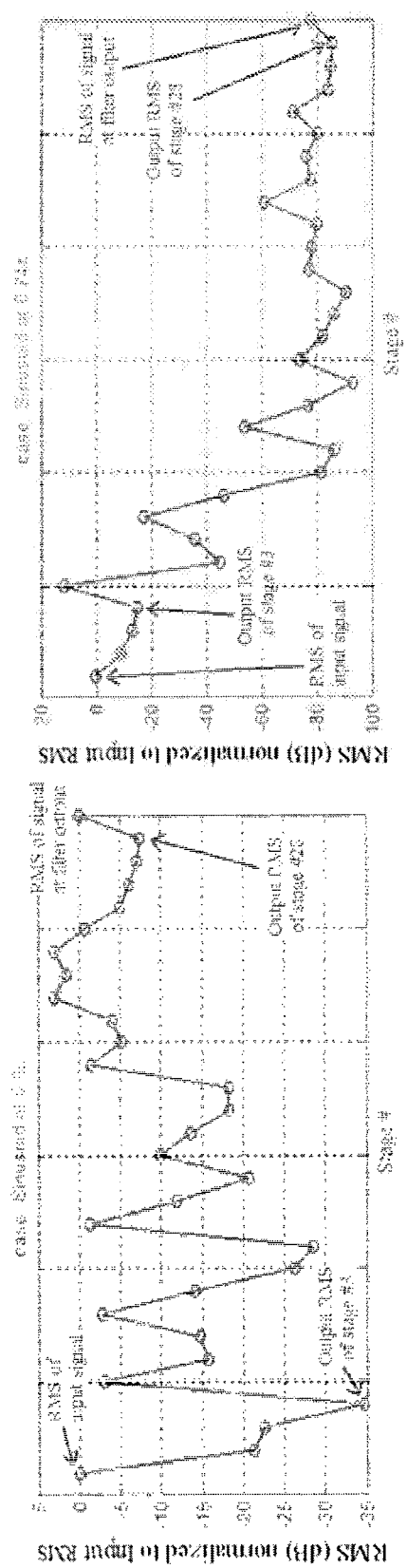
FIG. 26 depicts an RMS output of stages of the exemplary 17+1 bit jointly-sequenced optimally-factored IFIR filter in FIG. 24 (Tests 3 and 4).

The stage sequencing as listed in Table 3 and Table 4 are based on the individual sequencing (Mehrnia III) of factors for $G(z^3)$ and I(z). A better implementation of this cascade is shown in FIG. 24. It is based on the joint sequencing of the $G(-z^3)$ and $I(-z)$ factors. It results in a "considerably more tamed" cascade structure (smaller RMS increases) with a 17-bit (plus sign bit) data path. The jointly-sequenced cascade of FIG. 24 has the same hardware complexity as is summarized in Table 5. The jointly sequenced stages are identified by the numbers (1 through 28) given to them in Tables 3 and 4. And in FIG. 24, according to these stage numbers, they are ordered this way: [1 14 2 12 4 10 5 6 15 7 8 11 18 16 13 20 3 17 21 26 27 24 25 22 19 23 28]. The RMS behavior of this jointly sequenced cascade is illustrated in FIGS. 25 and 26, which clearly demonstrate a "more tamed" cascade structure (smaller RMS increases) in comparison to FIGS. 21, 22 and 23.

V. ADDITIONAL FACTORED STRUCTURE EMBODIMENTS FOR THE 121-TAP FILTER

A Nested IFIR Implementation.

Figure 27:
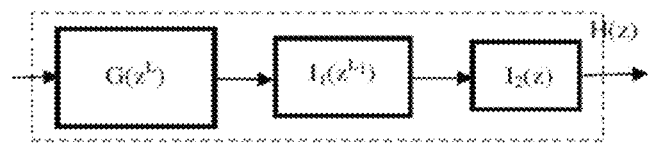
FIG. 27 depicts an exemplary two-variable (nested) IFIR structure for the 121-tap filter.

This is an extension of the IFIR filter to a multi-stretch-factor system (Mehrnia I). In summary, for a very demanding design (as identified by the IFIR triangle region (Mehrnia I)), one similar to the 121-tap filter, it becomes evident that the image suppression (interpolator) filter I(z) might itself benefit from an IFIR implementation. This naturally leads to the structure of FIG. 27 having two stretch factors, L and $L_1$. The IFIR design of I(z) in FIG. 27 should not be performed independently, but rather as a part of the overall design of the H(z). According to Mehrnia I, the optimum choice of stretch factors L and $L_1$ minimizes the following function representing the total number of multipliers:

$$f(L, L_1) = \frac{1}{L(\omega_s - \omega_p)} + \frac{1}{L_1\left(\left(\frac{2\pi}{L} - \omega_s\right) - \omega_p\right)} + \frac{1}{\frac{2\pi}{L_1} - \left(\frac{2\pi}{L} - \omega_s\right) - \omega_p}$$

where $$L_1 \leq L \leq \frac{2\pi}{\omega_s + \omega_p}$$

Figure 28:
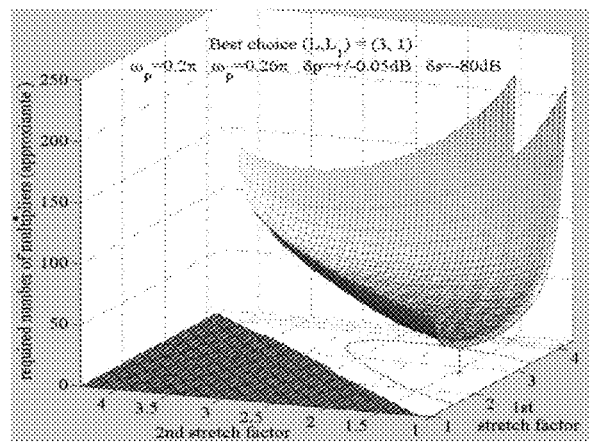
FIG. 28 depicts an exemplary best choice of stretch factors for the case of two-variable IFIR implementation of 121-tap filter.
Figure 28:
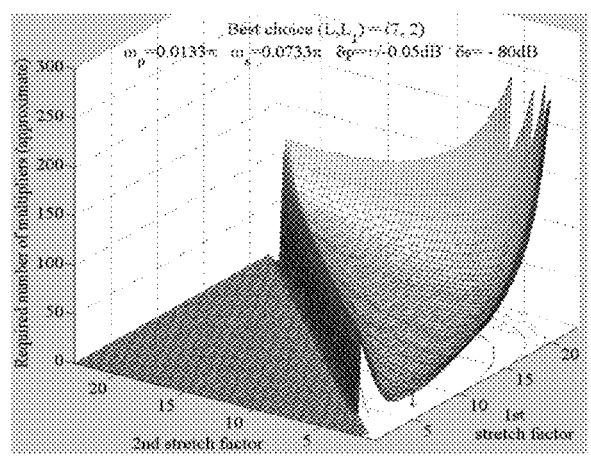
Figure 29:
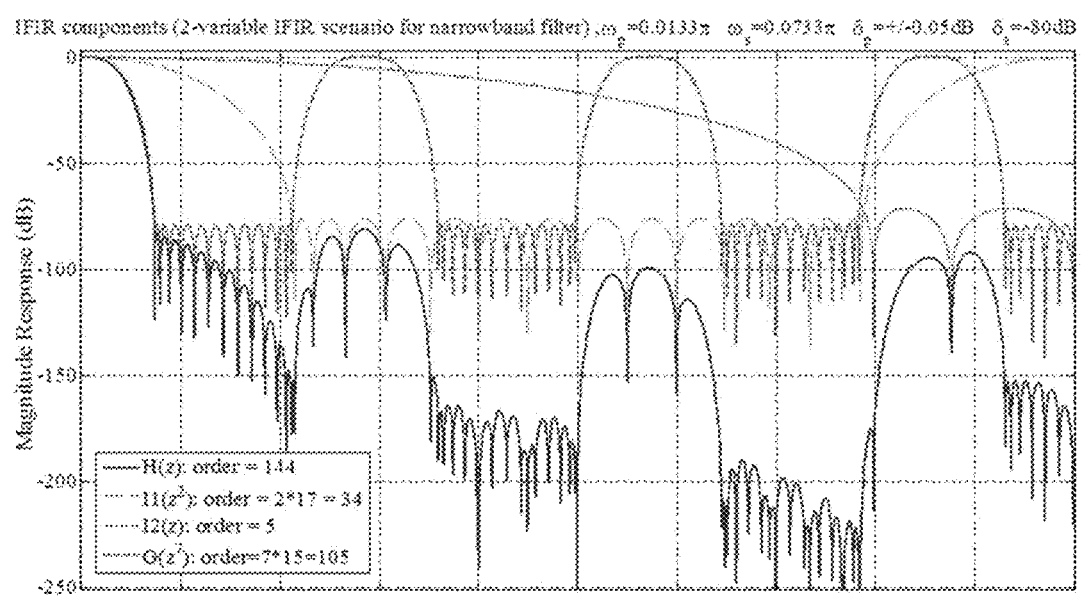
FIG. 29 depicts magnitude plots of G(z), $I_1(z)$ and $I_2(z)$ components of the exemplary two-variable IFIR design of narrowband filter in FIG. 28.

This function of two-variables is plotted in FIG. 28 for the cases of (Top) a wideband 121-tap filter (Example 3) and also (Bottom) a narrowband version (passband edge 0.0133π rad.) of the 121-tap filter (which will be Example 4, discussed below). As illustrated, there is no benefit in extending the IFIR method to two variables for the wideband 121-tap filter of Example 3 since the optimum choices are L=3 and $L_1$=1, indicating a non-stretched image suppressor filter $I_1$(z). For the narrowband 121-tap filter case (Example 4), however, the bottom plot in FIG. 28 indicates the optimum choices of stretch factors are L=7 and $L_1$=2. The resulting overall magnitude response is plotted in FIG. 29, which also shows the magnitude responses of the three components $G(z^7)$, $I_1(z^2)$ and $I_2(z)$. This H(z) has a total order of 144, requiring 144 registers, which exactly matches the order and registers of the overall filter if designed with a single-variable IFIR as discussed below in Example 4. In summary, while the two-variable IFIR design of the narrow-band filter requires 37 structural adders, compared to the 43 needed for the single-variable design, as detailed below, the total number of adders required for the three components of the two-variable IFIR design is more than the 52 adders needed for the single-variable design, as will be discussed in Example 4. However, the results clearly indicate that for a just slightly more demanding narrow-band filter, the optimally-factored nested IFIR filter could provide a valuable technique to achieve lower implementation complexity.

Figure 30:
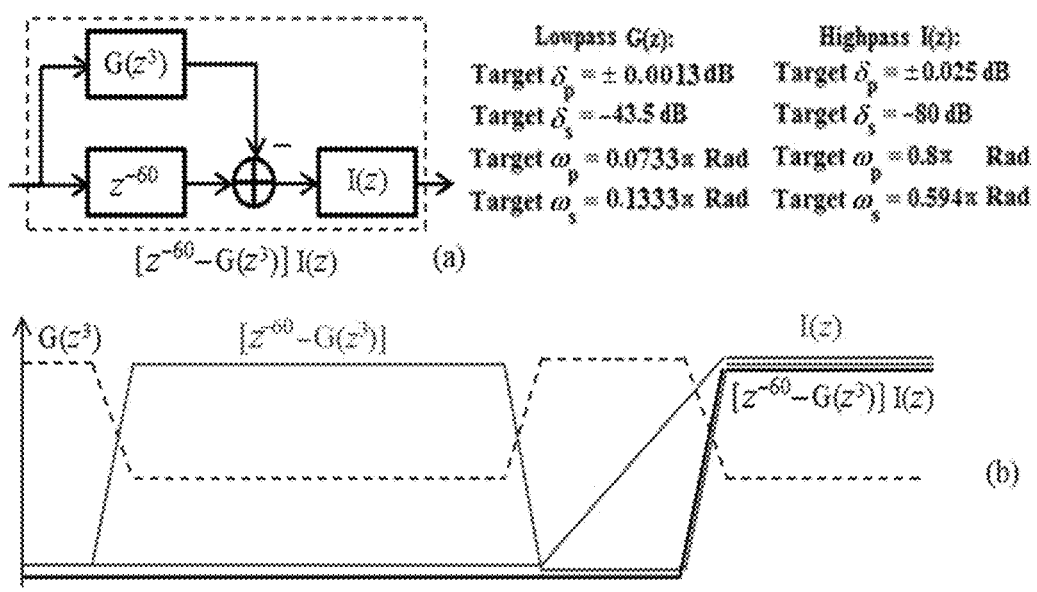
FIG. 30 depicts an exemplary filter masking implementation of wideband 121-tap filter of Example 3.

Filter-Masking Based Factored IFIR Implementation:

One can also employ embodiments of this factoring technique for the components of a filter-masking based IFIR structure (see Lim II) to implement wideband filters (and also as another method to implement bandpass or highpass filters, as an alternative to the well-known transformation methods that can immediately transform lowpass designs to highpass and bandpass FIR filters). For instance, the demanding wideband 121-tap filter of Example 3 can be implemented, using the filter masking technique (see Lim I), as shown in FIG. 30(a). A major feature of this method is the conversion of the target wideband filter implementation into the narrower-band design problem of getting $G(z^3)$ and I(z) as illustrated in FIG. 30(b). (The passband width of $G(z^3)$ is 0.073π, which is roughly one-third that of the original passband width target of 0.2π.) The main disadvantage is the need for 60 extra registers to create the $z^{-60}$ block shown in FIG. 30. This additional register requirement results in an excessive increase in the number of required flip-flops and hence yields an overall complexity (#FA+#FF) of more than 6000 compared to the 5530 (Table 5) that was obtained through the single-stretch-factor IFIR approach for the wideband filter. One can note here that there are known applications for higher-degree digital filters for which such optimally-factored filter-masking implementations may prove to be the best structure.

Example 4

Figure 31:
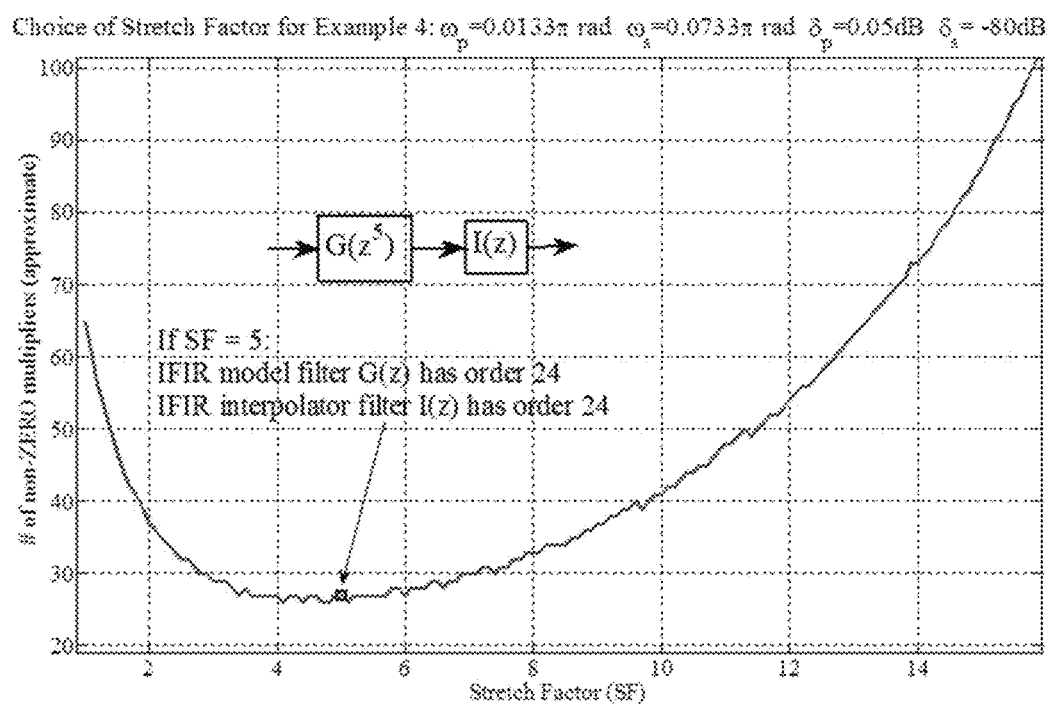
FIG. 31 depicts an exemplary choice of optimum stretch factor for filter in Example 4.

To further demonstrate the capabilities of the optimal factoring method one can examine its performance for a narrow-band version of the 121-tap filter of the wideband Example 3. The passband ripple, stopband attenuation and transition bandwidth are all the same as in Example 3 but here the passband bandwidth is 0.0133π rad. (small in comparison to the 0.2K rad. passband of Example 3.) So one can now consider a lowpass FIR filter H(z) with the following specifications:

Target 20 $\log_{10}(1\pm\delta_p)$=±0.05 dB: Target $\omega_p$=0.0133π rad;

Target 20 $\log_{10}(\delta_s)$=−80 dB; Target $\omega_s$=0.0733π rad;

The optimum choice of stretch factor Mehrnia I for this narrow-band 121-tap lowpass filter is illustrated in FIG. 31, which indicates orders of 24 and 24 for the model filter G(z) and the interpolator I(z), with the optimum stretch factor of SF=5.

The best identified optimally-factored implementations of the I(z) and G(z) filters for the corresponding narrow-band filter are obtained using the theory and algorithms of Mehrnia III. The binary value and SPT representations of the coefficients for both the model filter G(z) and the interpolator filter I(z) are listed in Table 7 and Table 8, respectively. These tables indicate that merely seven shift-adds and two shift-adds are needed to implement all the required SPT multiplier coefficients for G(z) and I(z), respectively. One can observe from Table 7 that 23 structural adders are needed to realize a G(z) that is of order 24. Also, Table 8 indicates that I(z) needs only twenty structural adders—although I(z) is of order 24.

TABLE 7

Model Filter Quantized Stages

| | Quantized 10 Stages | Binary for nontrivial coeffs. | SPT representation for nontrivial coefficients |
|---|---|---|---|
| 1: | $1 + z^{-2}$ | none | none |
| 2: | $(1 + z^{-4}) - 0.9375(z^{-1} + z^{-3}) - 0.75z^{-2}$ | [−0.1111 −0.11] | $[-2^0 +2^{-4} -2^{-1} -2^{-2}]$ |
| 3: | $1 - 0.8125\ z^{-1} + z^{-2}$ | −0.1101 | $-2^{-1} -2^{-2} -2^{-4}$ |
| 4: | $(1 + z^{-4}) - 0.25(z^{-1} + z^{-3}) + 1.75z^{-2}$ | [−0.01 1.11] | $[-2^{-2}\ 2^1 -2^{-2}]$ |
| 5: | $1 - 0.375\ z^{-1} + z^{-2}$ | −0.011 | $-2^{-2} -2^{-3}$ |
| 6: | $1 + z^{-1} + z^{-2}$ | none | none |
| 7: | $1 + 1.5z^{-1} + z^{-2}$ | 1.1 | $2^0 +2^{-1}$ |
| 8: | $1 + 2z^{-1} + z^{-2}$ | none | $2^1$ |
| 9: | $1 + 2z^{-1} + z^{-2}$ | none | $2^1$ |
| 10: | $1 + 4z^{-1} + z^{-2}$ | none | $2^2$ |

TABLE 8

Interpolator Filter Quantized Stages

| | Quantized 8 Stages | Binary for nontrivial coeffs. | SPT representation for nontrivial coefficients |
|---|---|---|---|
| 1: | $(1 + z^{-4}) - (z^{-1} + z^{-3}) - 1.75z^{-2}$ | [−1 −1.11] | [none $-2^1 +2^{-2}$] |
| 2: | $1 + z^{-2} + z^{-4}$ | [none none] | [none none] |
| 3: | $1 + 1.75\ z^{-2} + z^{-4}$ | [none 1.11] | [none $2^1 -2^{-2}$] |
| 4: | $(1 + z^{-4}) + (z^{-1} + z^{-3}) + 0.5z^{-2}$ | [1 0.1] | [none $2^{-1}$] |
| 5: | $1 - 0.25\ z^{-1} + z^{-2}$ | −0.01 | $-2^{-2}$ |
| 6: | $1 + 0.125z^{-1} + z^{-2}$ | 0.001 | $2^{-3}$ |
| 7: | $1 + 2z^{-1} + z^{-2}$ | 10.0 | $2^1$ |
| 8: | $1 + 2z^{-1} + z^{-2}$ | 10.0 | $2^1$ |

In summary, the optimally-factored IFIR implementation of the narrow-band 121-tap filter of Example 4 requires only 52 shift-adds (56 if including a post-filter multiplier) and 144 registers.

Figure 32:
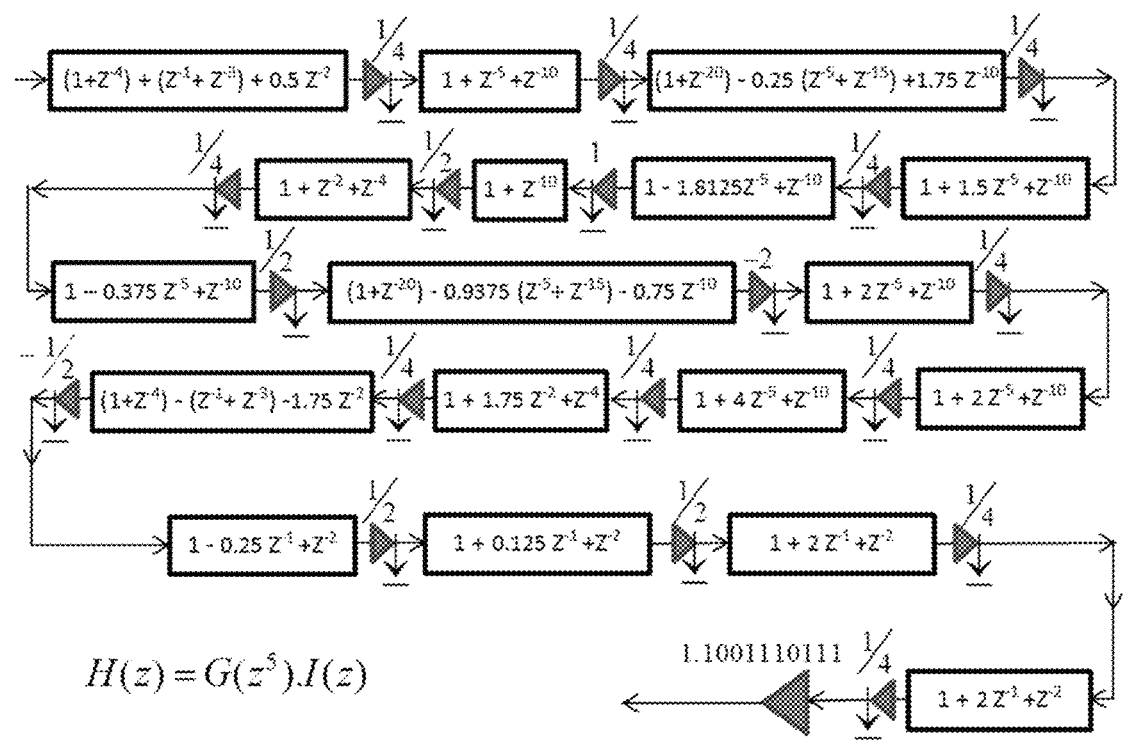
FIG. 32 depicts an exemplary jointly-sequenced optimally-factored IFIR structure (Example 4).
Figure 33:
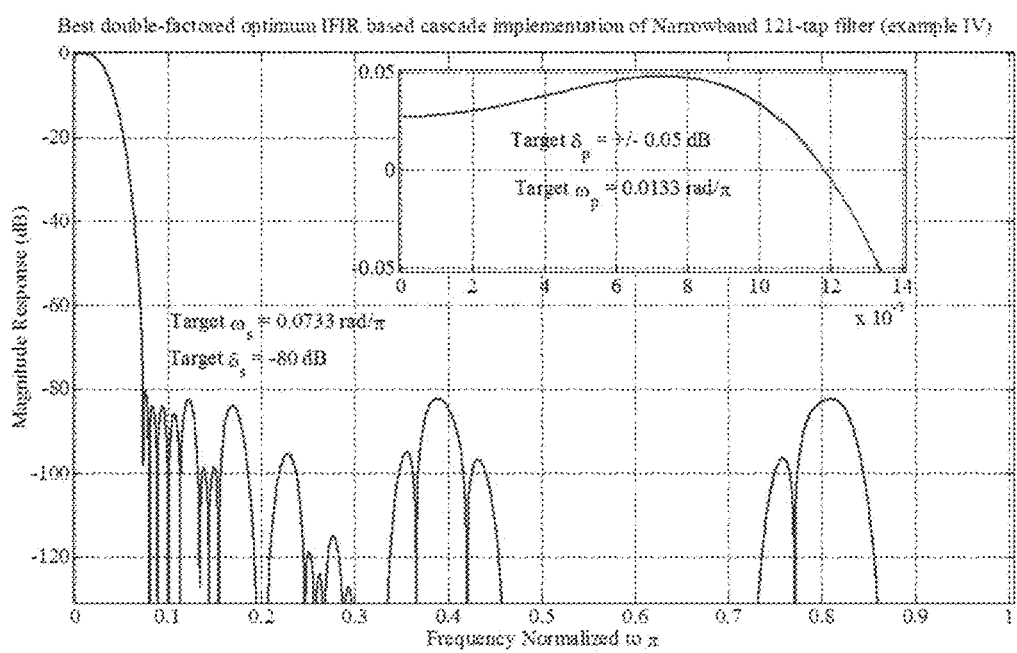
FIG. 33 depicts a magnitude plot of exemplary optimally-factored IFIR (SF=5) narrow-band 121-tap filter (Example 4).
Figure 34:
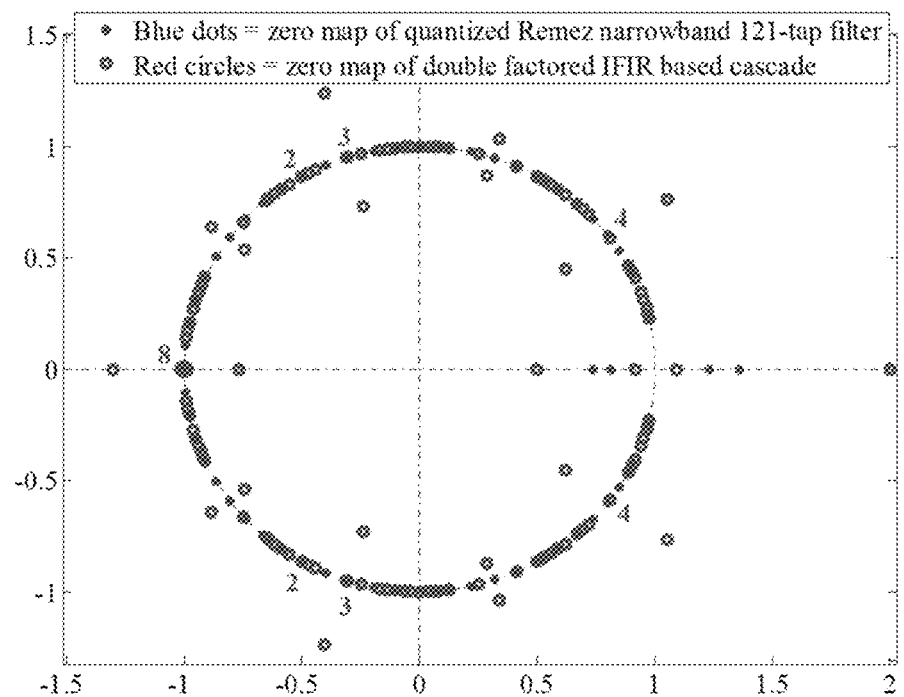
FIG. 34 depicts a zero map of the exemplary optimally-factored IFIR 121-tap filter (Example 4).
Figure 35:
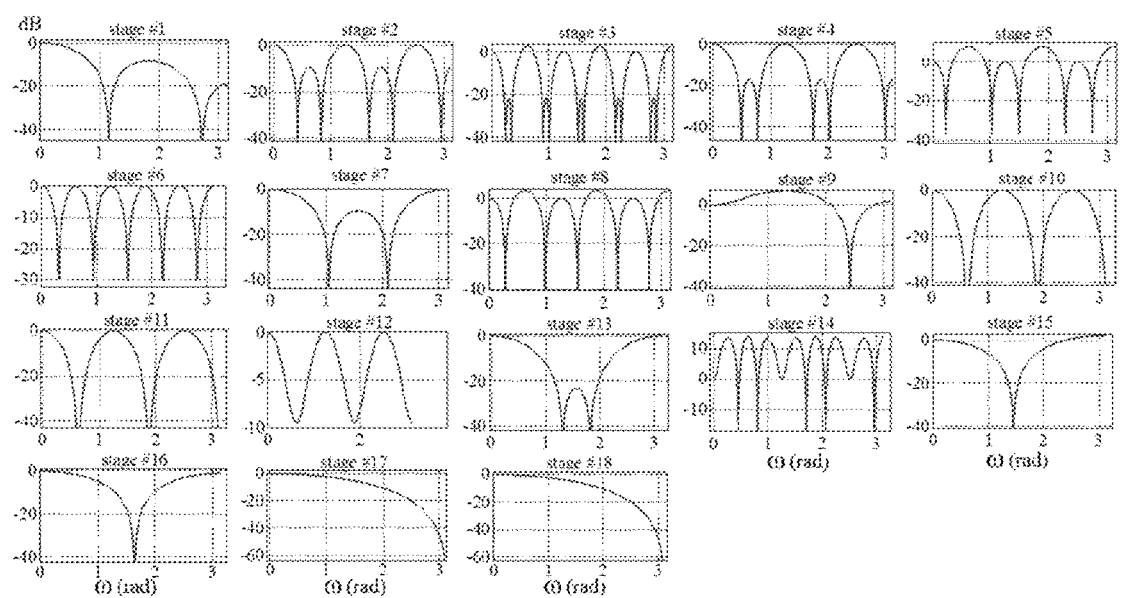
FIG. 35 depicts magnitude plots of the exemplary 18 stages in FIG. 32 (Example 4).

FIG. 32 shows the resulting optimally-factored IFIR cascade structure of the narrow-band filter H(z) of Example 4. The stage sequencing for this implementation is based on the joint sequencing of factors for the model filter G(z) and the interpolator filter I(z). This cascade achieves the target performance and specification using a uniform 16-bit data path (excluding sign bit). Also, if needed, the structure in FIG. 32 has the flexibility to support pipelining through the insertion of registers between stages, to support very high sampling rates. Given that the wordlength of the cascade stages is 16+1 bits (including the sign bit), that would indicate a total of 884 full-adders and 2448 flip-flops, hence a total complexity of 3332 for a non-pipelined system and 3621 for the fully-pipelined implementation (17 pipelining registers needed, given that there are 18 stages in FIG. 32). A complexity summary of this proposed jointly-sequenced factored IFIR structure, and a comparison with the lowest complexity of the aforementioned wideband 121-tap filter of Example 3, are given in Table 9. FIG. 33 and FIG. 34 show the magnitude plot and zero map for the FIG. 32 optimally-factored IFIR filter implementing the narrowband 121-tap filter. The (FIG. 33) frequency response of the IFIR cascade (SF=5) demonstrates superior stopband characteristics. The frequency responses of all of the 18 stages of the model filter G(z) and interpolator (masking) filter I(z) are shown in FIG. 35 (according to the exact sequence of stages in FIG. 32) indicating desirable tamed responses for all the 18 stages (no considerable amplification of out-of-band portion of signal.)

TABLE 9

Hardware Complexity Summary

| Hardware complexity for factored IFIR filter design method | MA | SA | Total # of Adders | Full Adders (FA) | D flip-flops (FF) | Total Complexity (FA + FF) |
|---|---|---|---|---|---|---|
| Optimally factored IFIR design Example 4 H(z) = G(z³)I(z) FIG. 32 (B = 17 + 1 bits) | 9 | 43 | 52 | 884 (B = 16 + 1 bits) | 2448 2737 for fully pipelined case | 3332 full pipelined: 3621 (B = 16 + 1 bits) |
| Optimally factored IFIR design Example 3 H(z) = G(−z³)I(−z) FIG. 24 (B = 17 + 1 bits) | 61 | 80 | 141 | 2578 (B = 17 + 1 bits) | 2952 3441 for fully pipelined case | 5530 full pipelined: 6019 (B = 17 + 1 bits) |

Figure 36:
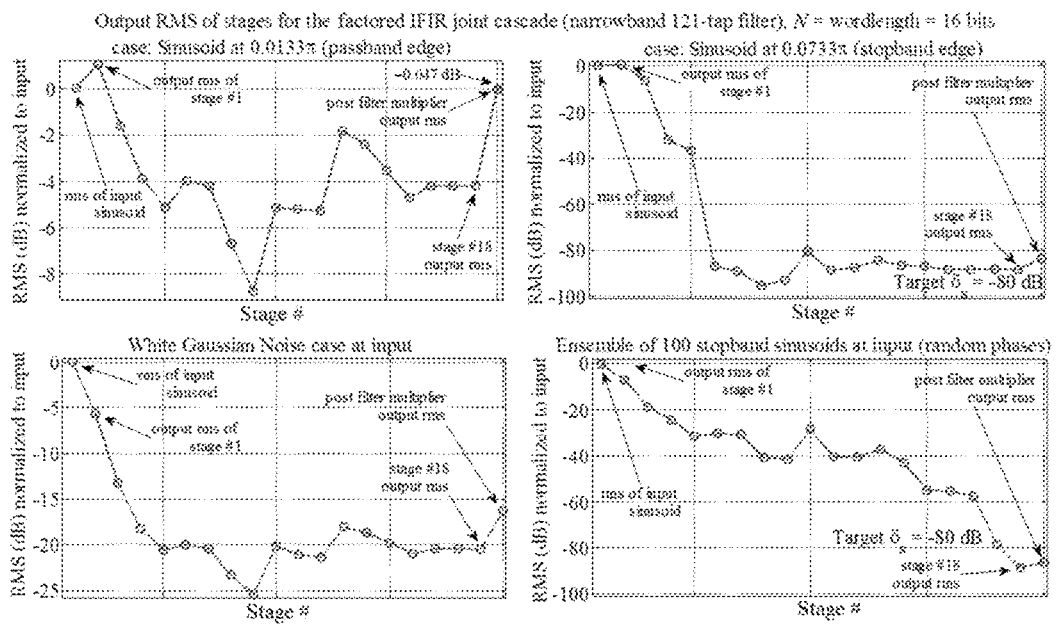
FIG. 36 depicts an output RMS of stages of the exemplary jointly-sequenced optimally-factored IFIR filter structure in FIG. 32 (Example 4).

Similar to the wideband case of Example 3, to demonstrate the effectiveness of the stage sequencing as implemented in the optimally-factored IFIR joint cascade of FIG. 32, one can use the Four-Test procedure with the input signal RMS set at $2^{N-1.5}$ in all cases, where N=16 (excluding sign bit) is the word length of the data path through the model filter $G(z^5)$ and the interpolator I(z) stages. FIG. 36 demonstrates that the presented structure of FIG. 32 with a (16+1)-bit uniform data-path (including sign bit) at the output of all stages is able to fully attenuate the stopband portion of the input signal (including the sinusoid at the edge of stopband) and is able to perfectly pass the passband signal (including the sinusoid at the edge of passband) with negligible (<0.05 dB) attenuation.

VI. ORDER-62 FILTER EXAMPLE FROM LIM III, YU AND AKTAN

Example 5

One can now consider the highly cited order-62 wideband filter (see Lim III) with the following specifications:
Passband edge $\omega_p$=0.2π rad.; Stopband edge $\omega_s$=0.28π rad.
Ripple $\delta_p$=0.028 (±0.24 dB); Attenuation $\delta_s$=0.001 (−60 dB);
Similar to the case of 121-tap filter in Section IV, this filter, referred to as filter L2 in Aktan, is a good example because several previous publications (see Aktan, Samueli, Lim III, Yao I, Yao II, Yu, Shi I and Shi II) have chosen to use this filter when presenting their own filter design and implementation methods. These include FIRGAM and Remez algorithms (see Aktan), an algorithm (LIM) from Lim III, the Partial Mixed-Integer Linear Programming (PMILP) algorithm of Yao I and Yao II, and single- and dual-stage cascade designs using coefficient optimization algorithms in Shi I and Shi II. Herein, an optimally-factored interpolated FIR (IFIR) implementation of filter L2 is proposed, and its complexity compared with the alternative designs.

Figure 37:
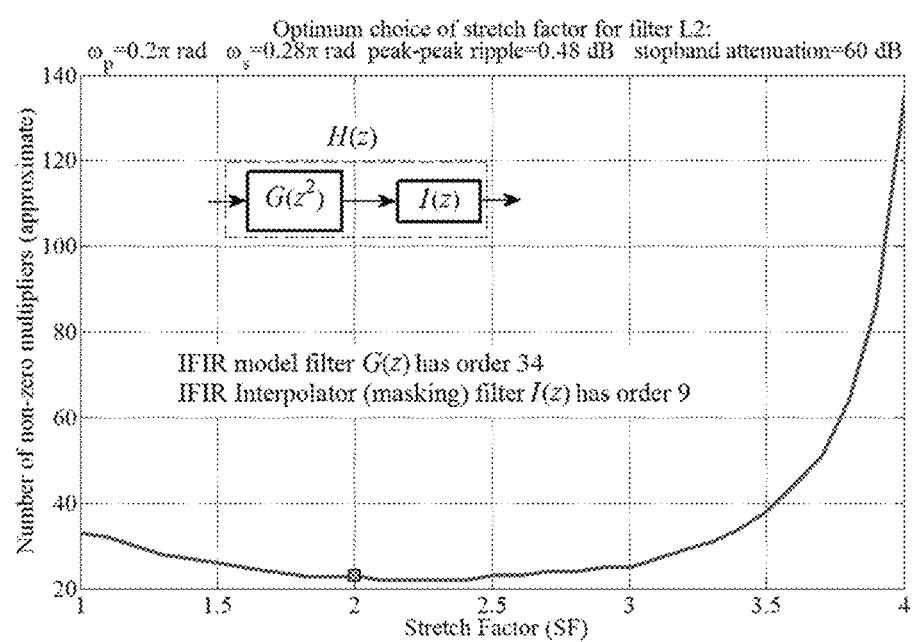
FIG. 37 depicts an exemplary choice of optimum stretch factor for order-62 filter (Example 5).
Figure 38:
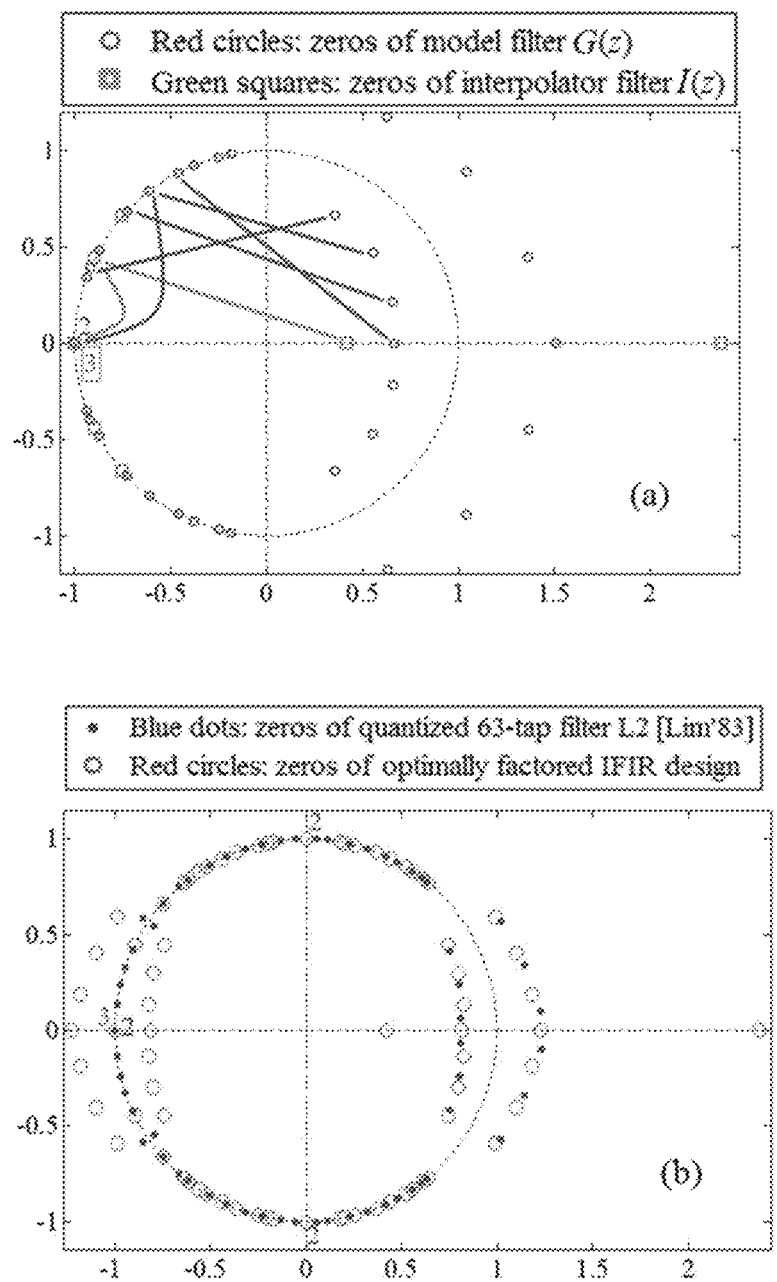
FIG. 38 depicts zero maps of IFIR components G(z) and I(z) and optimal pairings for the exemplary optimally-factored IFIR versus zeros of order-62 filter L2 (dots).

The optimum stretch factor (SF=2) for this order-62 filter, via Mehrnia I, is illustrated in FIG. 37, and it leads to orders of 34 and 9 for the model filter G(z) and the interpolator filter I(z), respectively. Filter L2 has the 62 zeros shown as dots in FIG. 38(b), of which sixteen are off the unit circle (representing four $4^{th}$-order factors) and 46 zeros lie on the unit circle (representing 22 complex conjugate zero pairs and two zeros at $\omega=\pi$). An exhaustive pairing and factoring of all complex conjugate zero-pairs would, of course, be impractical since there are more than $6.5 \times 10^{14}$ possible factoring choices for model filter G(z). (See Mehrnia III and Mehrnia IV.) Employing embodiments of this optimally-factored algorithm for this filter, as presented in Mehrnia, the best identified optimal factors for G(z) and I(z) (Table 10, Table 11 and FIG. 39) are found using the algorithm of Mehrnia III. Results are illustrated in FIG. 38(a) which show the optimal pairing of zeros for the G(z) and I(z) filters. FIG. 38(b) compares zeros of the resulting optimally-factored IFIR design vs. the 62 zeros (dots) of the original 63-tap filter L2 according to Lim III. The binary value and SPT representations of the coefficients for both G(z) and I(z) are listed in Tables 10 and 11, respectively, which indicate that 12 shift-adds and one shift-add are needed to implement all the required multipliers for the G(z) and I(z) coefficients, respectively. It is now observed that, according to Table 10, 33 structural adders (SA) are needed to realize the degree-34 G(z), and Table 11 shows that the degree-9 I(z) needs merely seven structural adders. Therefore the resulting optimally-factored IFIR implementation requires 13 MA (multiplier adders) and 40 SA as is also summarized in Table 12. Similar to previous design cases, a practical realization of the factored $G(z^2)I(z)$ cascade requires a careful choice of stage sequencing Mehrnia III to effectively manage the wordlength of the data path through the cascade of stages. The best identified stage order in joint sequencing of the $G(z^2)$ stages and the I(z) stages according to the sequencing algorithm in Mehrnia III for this optimally-factored IFIR implementation of filter L2 is:

Stage Order=8 12 4 6 3 7 5 2 9 1 10 13 11, where numbers 1 to 13 correspond to row numbers in Tables 10 and 11.

TABLE 10

Model Filter Quantized Stages

| Optimally factored G(z) | Binary representation absolute values of taps |
|---|---|
| 1: $1 + z^{-4} - 1.25(z^{-1} + z^{-3})$ | 1.01 0 |
| 2: $1 + 0.375 z^{-1} + z^{-2}$ | 0.011 |
| 3: $1 + 0.5 z^{-1} + z^{-2}$ | 0.1 |
| 4: $1 + 0.75 z^{-1} + z^{-2}$ | 0.11 |
| 5: $1 + z^{-7} - 0.96875(z^{-1} + z^{-6}) -$ | 0.11111 |
| $0.15625(z^{-2} + z^{-5}) + 1.21875(z^{-3} + z^{-4})$ | 0.00101 1.00111 |
| 6: $1 + z^{-6} - 2.59375(z^{-1} + z^{-5}) +$ | 10.10011 1.01 |
| $1.25(z^{-2} + z^{-4}) + 0.875 z^{-3}$ | 0.111 |
| 7: $1 + 1.75 z^{-1} + z^{-2}$ | 1.11 |
| 8: $1 + z^{-6} - 0.125(z^{-1} + z^{-5}) +$ | 0.001 |
| $0.625(z^{-2} + z^{-4}) + 2 z^{-3}$ | 0.101 10.0 |
| 9: $1 + 1.875 z^{-1} + z^{-2}$ | 1.111 |
| 10: $1 + z^{-1}$ | none |

TABLE 11

Interpolator Filter Quantized Stages

| Optimally factored I(z) | Binary representation of absolute values of taps |
|---|---|
| 11: $1 - 4(z^{-2} + z^{-3}) + z^{-5}$ | 0 100 |
| 12: $1 + 1.5 z^{-1} + z^{-2}$ | 1.1 |
| 13: $1 + 2 z^{-1} + z^{-2}$ | 10.0 |

Figure 39:
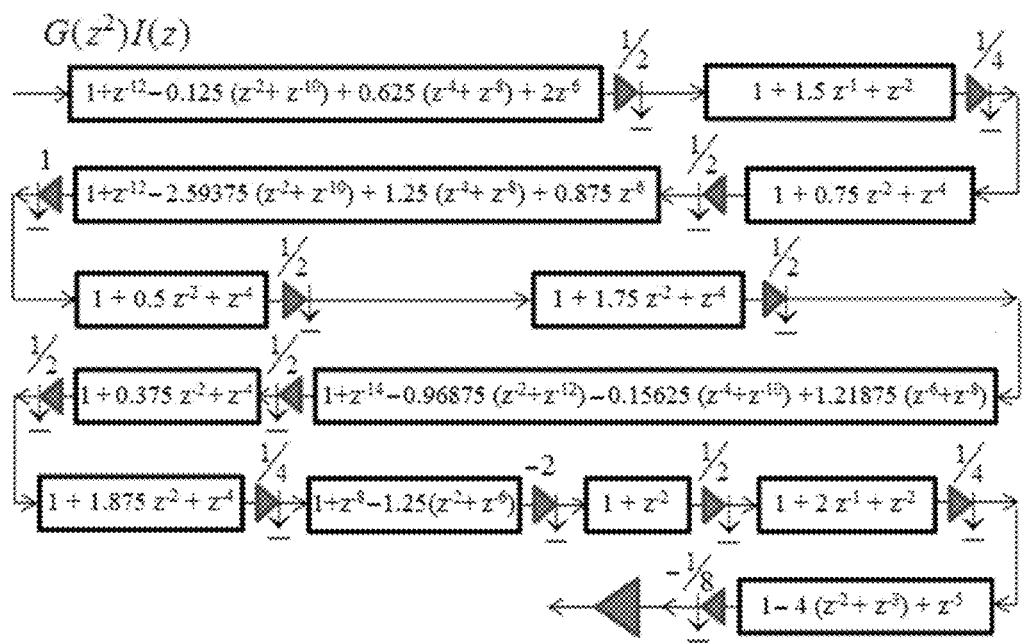
FIG. 39 depicts an exemplary optimally-factored Interpolated FIR implementation of filter L2.
Figure 40:
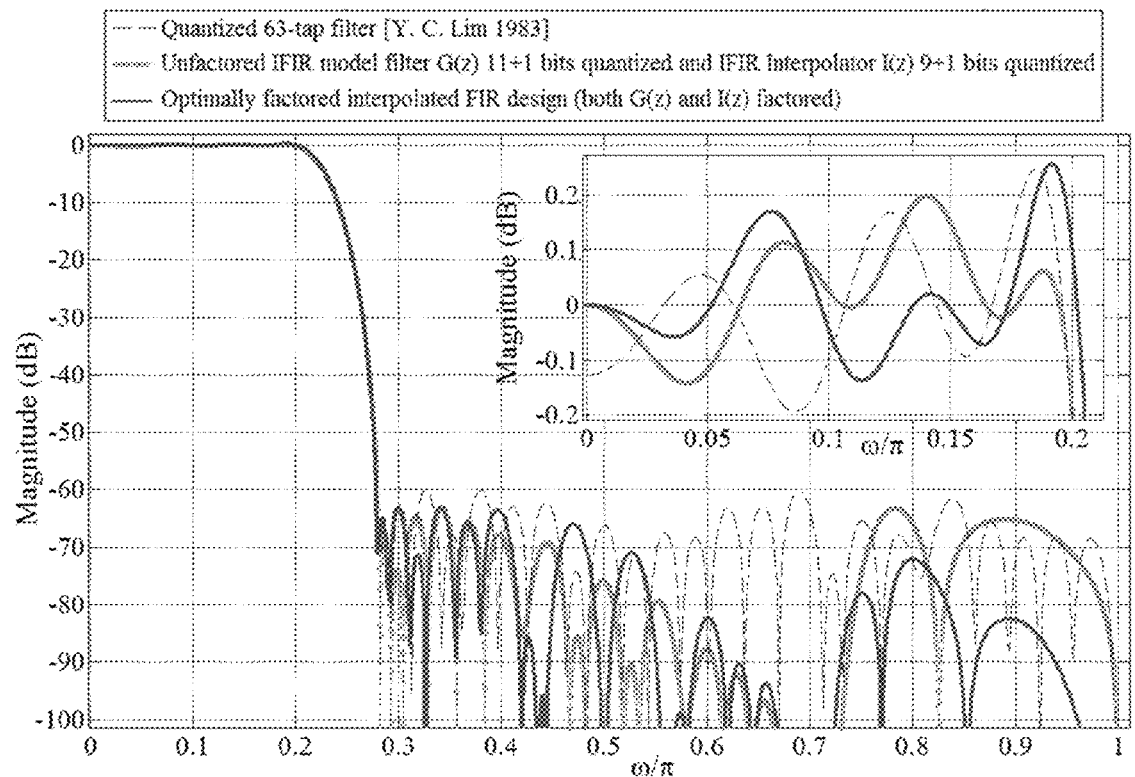
FIG. 40 depicts magnitude plots of the exemplary optimally-factored IFIR (SF=2) filter (solid) vs. 63-tap filter (dash).
Figure 41:
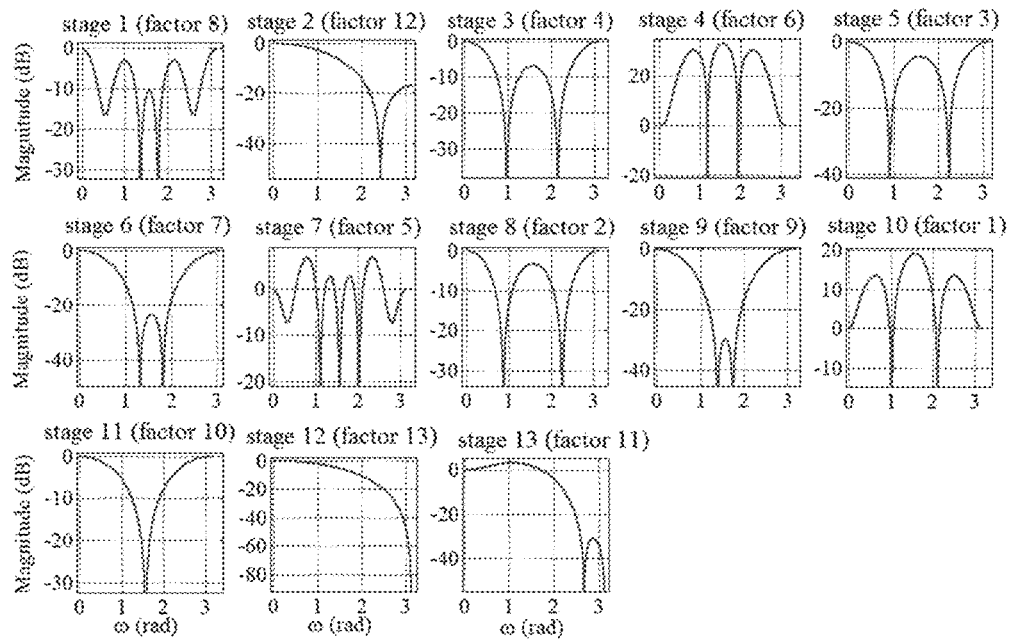
FIG. 41 depicts magnitude plots of the exemplary 13 stages in FIG. 39 (Example 5).

The resulting optimally factored interpolated cascade structure for Filter L2 is shown in FIG. 39. The magnitude plot for the FIG. 39 optimally-factored IFIR filter is shown in FIG. 40. Its stopband behavior exceeds specifications, especially at mid and high frequencies. Its peak-to-peak passband ripple is 0.395 dB compared to the target 0.48 dB. The frequency responses corresponding to the jointly sequenced 13 stages are shown in FIG. 41. Given the target stopband attenuation of $-20 \log_{10}(\delta_s)=60$ dB, the M=13 stages, and the target peak-to-average power ratio margin (PAPR_margin), it can be shown (see Mehrnia I) that the truncation level (wordlength) N should be at least 13 bits (excluding sign bit) for a uniform wordlength realization of the cascade filter in FIG. 39 that has 13 stages. For a single-stage (conventional) design that meets the target filter specification of Example 5, it would suffice to have a signal wordlength of at least 11 bits (excluding sign bit). To examine the effectiveness of the stage sequencing as implemented in the cascade of FIG. 39, one can use the following comprehensive tests with input signal RMS set at $2^{N-1.5}$ (PAPR_margin of 1.5-bit) in all cases where N is the truncation level (wordlength of the signal) excluding sign bit.

One can then measure the output RMS values of all cascade stages.

1) Input signal is an ensemble of 50 in-band sinusoids (random phases). One can expect the signal to traverse the factored filter unaffected and the output to be a delayed version of the input.

2) Input signal is a white Gaussian noise signal (uniform power across all frequencies). One can expect embodiments of this filter to attenuate the portion of the signal that falls in the stopband ($\omega_s \geq 0.28\pi$) by 60 dB.

3) Input signal is a colored Gaussian noise signal with uniform power only in the stopband. One can realize this using a sum of 100 random phase sinusoids uniformly distributed in the stopband ($\omega_s \geq 0.28\pi$). One can expect embodiments of this filter to attenuate the entire signal by at least 60 dB.

4) Input signal is a Sinusoid at passband edge ($\omega_p=0.2\pi$).

5) Input signal is a Sinusoid at stopband edge ($\omega_s=0.28\pi$).

Figure 42:
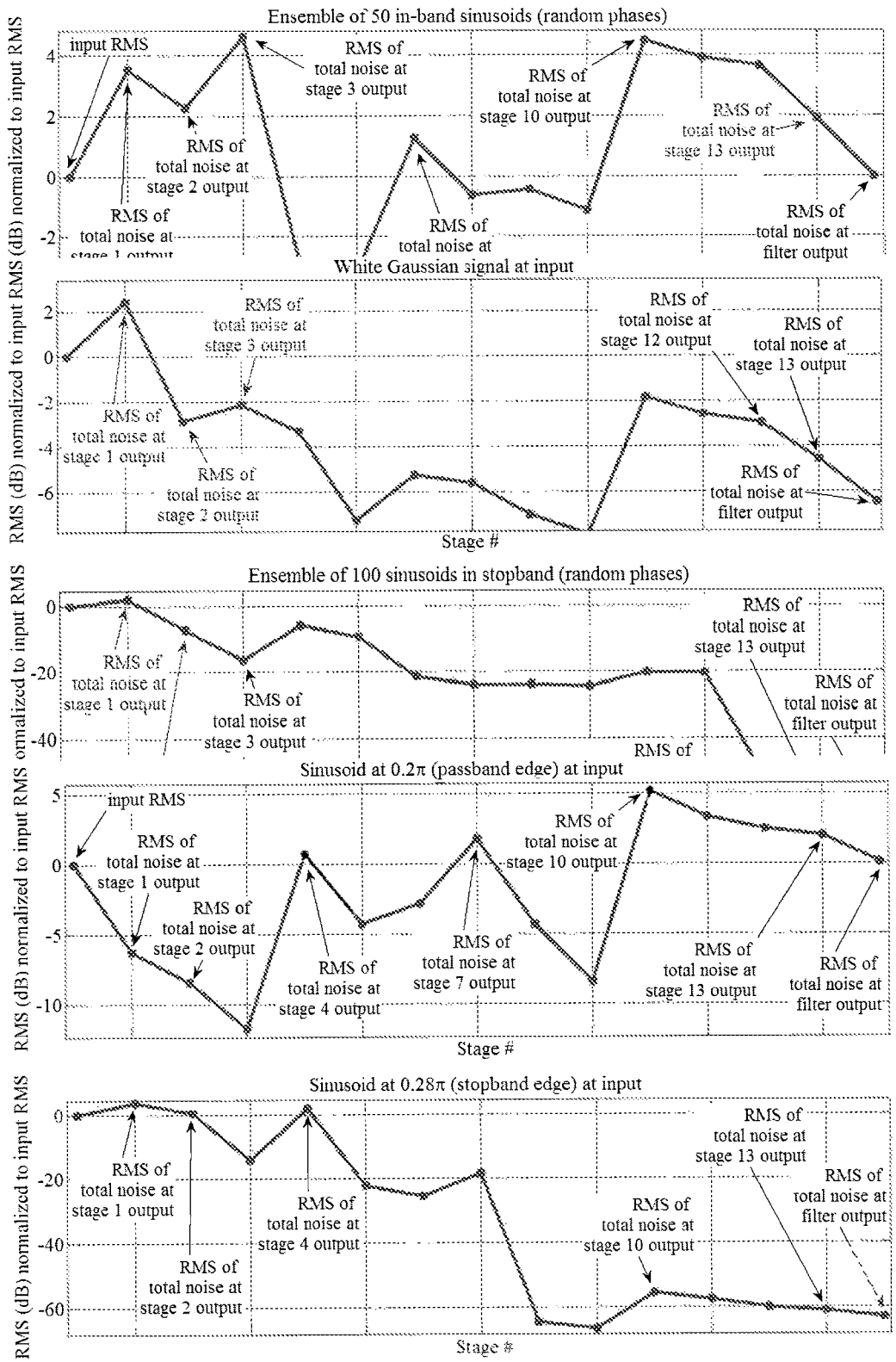
FIG. 42 depicts RMS of exemplary stage outputs in FIG. 39 for test scenarios (Example 4).

The results of the tests and corresponding signal RMS values at the output of stages are illustrated in FIG. 42. The RMS increases at a few of the stage outputs, above the input signal RMS level in the FIG. 42 plots, illustrates that if uniform wordlength is desired (for design simplicity) then N should be 13+1 bits (sign-bit included) when the input signal RMS is set to $2^{10.5}$ to allow a margin of 2.5-bit above RMS (the extra 1-bit more than the target 1.5-bit PAPR_margin accommodates the RMS increases as shown in the plots in FIG. 42).

A slightly more efficient realization is possible, employing the inherent flexibility of the factored structure which can accommodate non-uniform datapath wordlength (truncation levels) through the cascade (at the stage outputs). According to FIG. 42, while 13+1 bits are needed for truncation at the outputs of stages #1, #2, #3, #6, #10, #11, #12 and #13 to accommodate up to a 6-dB increase in the stage-output RMS values compared to the RMS of the filter input (which is set to $2^{10.5}$), only 12+1 bits are needed for truncation at the outputs of stages #4, #5, #7, #8 and #9.

A summary of hardware complexity and a comparison with the previously reported methods of implementing this order-62 filter L2 are given in Table 12, and it is evident that the optimally-factored IFIR filter has the lowest complexity.

TABLE 12

Hardware Complexity Comparison

| Hardware complexity for alternative filter design methods | MA | SA | Total # of Adders | Full Adders (FA) | D flip-flops (FF) | Total Complexity (FA + FF) |
|---|---|---|---|---|---|---|
| Optimally factored IFIR design $H(z) = G(z^3)I(z)$ FIG. 39 (B = 13 + 1 bits) Data wordlength = B bits | 13 | 40 | 53 | 740 (B = 13 + 1 bits) | 1058 1222 for fully pipelined case | 1798 full pipelined: 1962 (B = 13 + 1 bits) |
| Optimally factored when filter order = 64 [15] (B = 13 + 1 bits) Data wordlength = B bits | 31 | 60 | 91 | 1350 (B = 13 + 1 bits) | 920 1130 for fully pipelined case | 2270 full pipelined: 2480 (B = 13 + 1 bits) |
| Optimally factored filter order = 62 [15] (B = 13 + 1 bits) | 47 | 62 | 109 | 1580 (B = 13 + 1 bits) | 62B + 24 = 892 1102 for fully pipelined case | 2472 full pipelined: 2682 (B = 13 + 1 bits) |
| Two-stage cascade filter order = 62 [27] | 11 | 56 | 67 | 623 + 67B = 1427 (B = 12) | Our estimate: >1350 (B = 12) | Our estimate: >2777 (B = 12) |
| Single-stage design filter order = 62 [26] | 17 | 56 | 73 | 666 + 73B = 1542 (B = 12) | Our estimate: >1350 (B = 12) | Our estimate: >2892 (B = 12) |
| MILP method [25, 26] filter order = 62 | 17 | 62 | 79 | Our estimate: ~1500 (B = 12) | Our estimate: >1400 (B = 12) | Our estimate: >2900 (B = 12) |
| FIRGAM [20] filter order = 62 | 18 | 62 | 80 | Our estimate: 1533 (B = 12) 1213 if B = 8 [20] | Our estimate: >1400 (B = 12) 1154 if B = 8 [20] | Our estimate: >2933 (B = 12) |
| PMILP [23, 24] filter order = 62 | 19 | 62 | 81 | Our estimate: 1609 (B = 12) 1285 if B = 8 [20] | Our estimate: >1430 (B = 12) 1182 if B = 8 [20] | Our estimate: >3039 (B = 12) |
| LMS method [22] filter order = 62 | 23 | 62 | 85 | Our estimate: 1651 (B = 12) 1311 if B = 8 [20] | Our estimate: >1400 (B = 12) 1154 if B = 8 [20] | Our estimate: >3051 (B = 12) |
| Remez [20] filter order = 62 Data wordlength = B bits | 30 | 62 | 92 | Our estimate: 1878 (B = 12) 1510 if B = 8 [20] | Our estimate: >1530 (B = 12) 1281 if B = 8 [20] | Our estimate: >3408 (B = 12) |

Noise Analysis for the Factored IFIR Structure in FIG. 39

Figure 43:
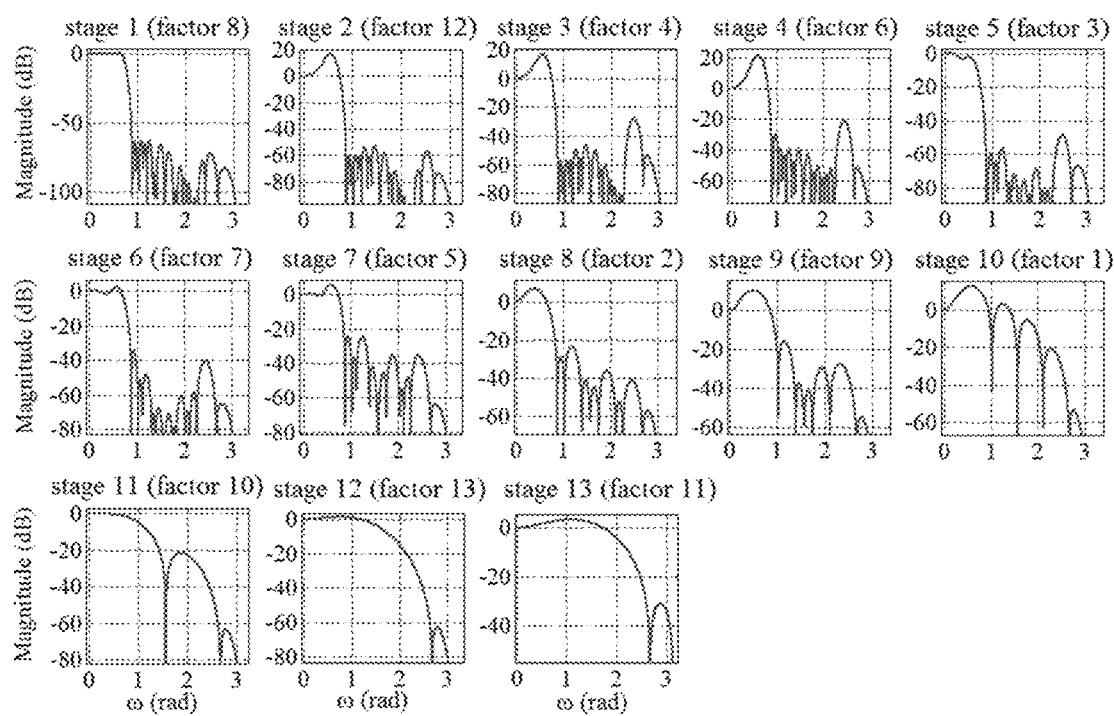
FIG. 43 depicts an effective total frequency response that each of the 13 noise sources experience from the point of truncation (at the output of each stage) to the output in the exemplary factored IFIR structure in FIG. 39.
Figure 44:
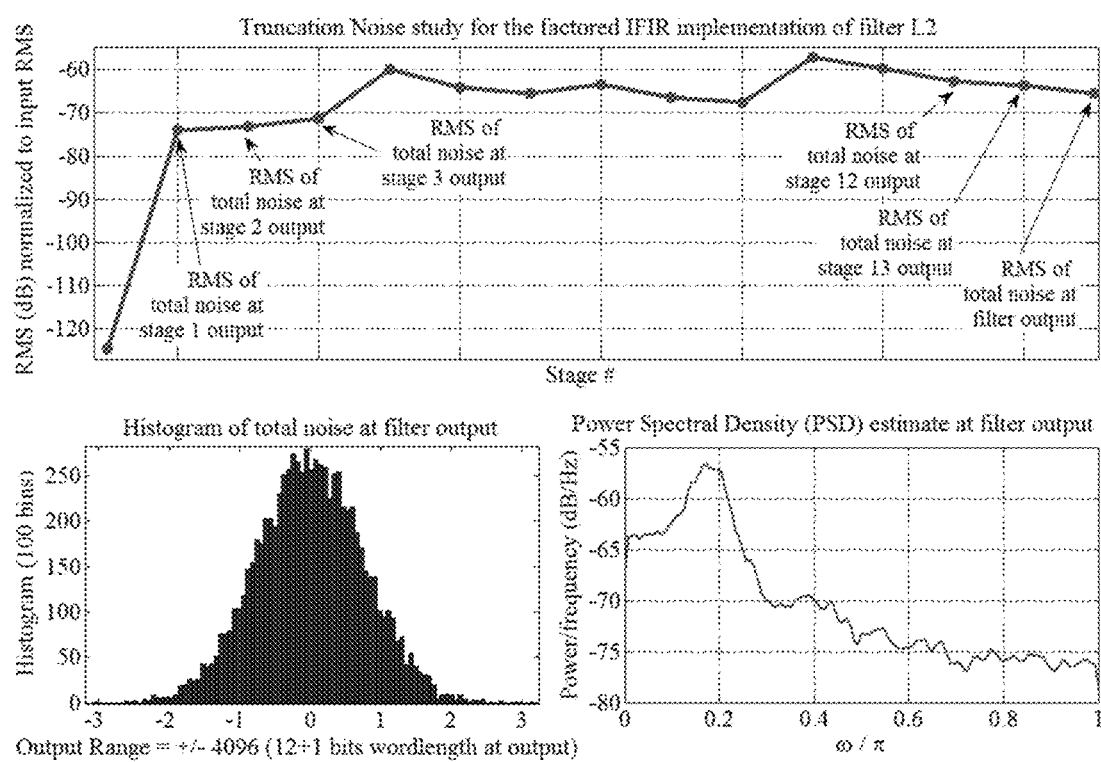
FIG. 44 depicts an overall effect of noise at the output of the exemplary optimally-factored IFIR structure in FIG. 39 taking into account all noise contribution from all stages (RMS of stage outputs, histogram and PSD).

In this section, one can examine the noise performance of the proposed optimally factored IFIR structure in FIG. 39. The truncation events at the outputs of the 13 cascaded stages inject quantization noise into the data stream throughout the factored filter structure in FIG. 39. These truncation events can be approximately modeled by 13 independent and identically distributed additive uniform noise sources at the output of the stages. FIG. 43 shows the effective total magnitude response that each of 13 noise sources experiences from the point of truncation (noise generation) to the output of the factored IFIR structure in FIG. 39. It confirms that none of the 13 noise sources experiences considerable noise amplification compared to the in-band level. The overall effect of truncation noise from all cascade stages at the filter output is also illustrated in FIG. 44. The bottom two plots are a histogram and a normalized PSD of the total noise at the factored filter output. The top plot shows the RMS of the total noise at the output of each stage. FIG. 44 shows that the overall output noise in the stopband is well below the target −60 dB stopband level that the filter is required to realize.

VII. CONCLUSION

A general method and the corresponding structure for a hardware-efficient implementation of FIR filters are proposed, based on combining the recently announced optimal factoring of FIR filters with optimally interpolated filter design. It has been shown that the new optimally-factored IFIR filters can provide better (more hardware-efficient) implementations of a wide variety of digital filters.

Figure 45:
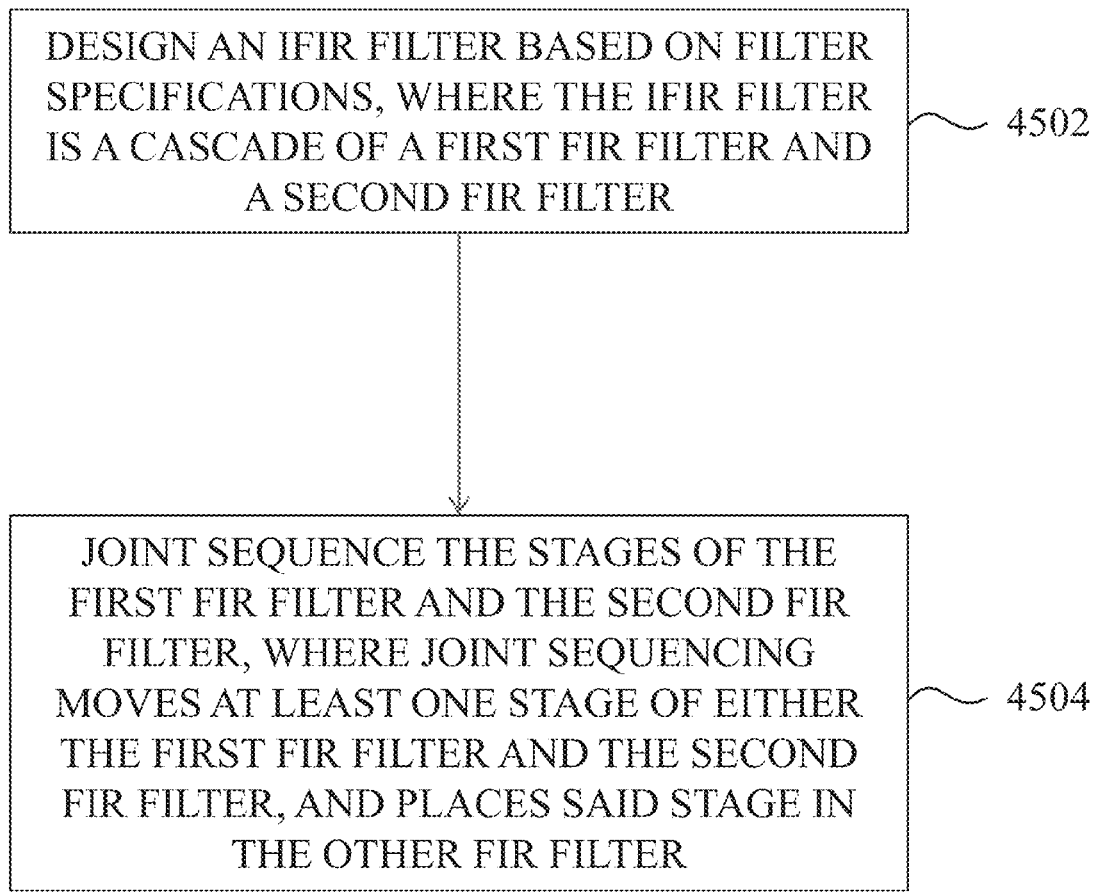
FIG. 45 depicts a flowchart of an exemplary method.

FIG. 45 illustrates a method 4500, according to an embodiment. The method may be used to design an efficient interpolated finite impulse response (IFIR) filter. The IFIR filter may be a digital filter, or an analog filter. The IFIR filter may be low pass filter, or the low pass filter may be transformed into a high pass filter. The method may be implemented in software and executed on a computing device, or implemented using hardware components.

Method 4500 begins at block 4502 where an interpolated finite impulse response (IFIR) filter is designed based on filter specifications. The IFIR filter design includes a cascade of a first finite impulse response (FIR) filter and a second FIR filter, where the first FIR filter and the second FIR filter include a first plurality of stages and a second plurality of stages respectively. An example of this IFIR filter is depicted in FIG. 3.

Figure 4:
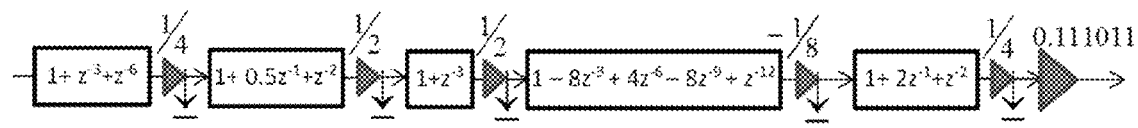
FIG. 4 depicts an exemplary joint sequencing of factors of model and interpolator filters (when SF=3 yielding an exemplary optimally-factored IFIR), according to an embodiment.

Next, at block 4504, joint sequencing of the stages of the first FIR filter and the stages of the second FIR filter is performed. Joint sequencing moves at least one stage of either the first FIR filter and the second FIR filter and places said stage in the other FIR filter. An example of joint sequencing is shown in FIG. 4, where the first stage of the second FIR filter (previously illustrated in FIG. 3) is moved to now be located as the second stage of the first FIR filter.

VIII. EXEMPLARY COMPUTER SYSTEM

Figure 46:
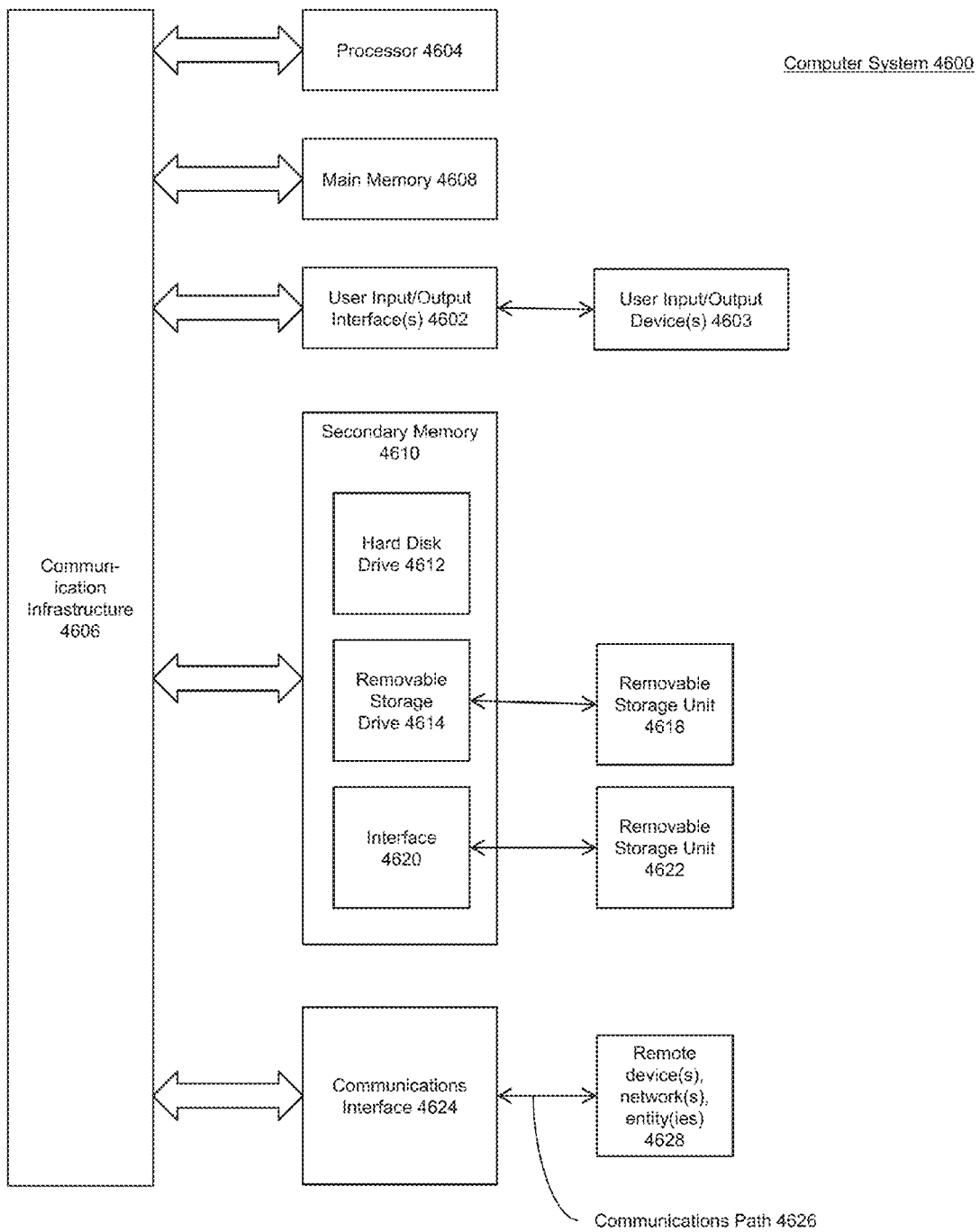
FIG. 46 depicts an exemplary computer system, according to embodiments of the present invention.

Embodiments of the invention may be implemented using hardware, programmable hardware (e.g., FGPA), software or a combination thereof and may be implemented in a computer system or other processing system. In fact, in one embodiment, the invention is directed toward a software and/or hardware embodiment in a computer system. An example computer system 4600 is shown in FIG. 46.

Computer system 4600 includes one or more processors (also called central processing units, or CPUs), such as a processor 4604. Processor 4604 is connected to a communication infrastructure or bus 4606. In one embodiment, processor 4604 represents a field programmable gate array (FPGA). In another example, processor 4604 is a digital signal processor (DSP).

One or more processors 4604 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 4600 also includes user input/output device(s) 4603, such as monitors, keyboards, pointing devices, etc., which communicate with communication infrastructure 4606 through user input/output interface(s) 4602.

Computer system 4600 also includes a main or primary memory 4608, such as random access memory (RAM). Main memory 4608 may include one or more levels of cache. Main memory 4608 has stored therein control logic (i.e., computer software) and/or data.

Computer system 4600 may also include one or more secondary storage devices or memory 4610. Secondary memory 4610 may include, for example, a hard disk drive 4612 and/or a removable storage device or drive 4614. Removable storage drive 4614 may be a floppy disk drive, a magnetic tape drive, a compact disc drive, an optical storage device, tape backup device, and/or any other storage device/drive.

Removable storage drive 4614 may interact with a removable storage unit 4618. Removable storage unit 4618 includes a computer usable or readable storage device having stored thereon computer software (control logic) and/or data. Removable storage unit 4618 may be a floppy disk, magnetic tape, compact disc, Digital Versatile Disc (DVD), optical storage disk, and/or any other computer data storage device. Removable storage drive 4614 reads from and/or writes to removable storage unit 4618 in a well-known manner.

Secondary memory 4610 may include other means, instrumentalities, or approaches for allowing computer programs and/or other instructions and/or data to be accessed by computer system 4600. Such means, instrumentalities or other approaches may include, for example, a removable storage unit 4622 and an interface 4620. Examples of the removable storage unit 4622 and the interface 4620 may include a program cartridge and cartridge interface (such as that found in video game devices), a removable memory chip (such as an EPROM or PROM) and associated socket, a memory stick and universal serial bus (USB) port, a memory card and associated memory card slot, and/or any other removable storage unit and associated interface.

Computer system 4600 may further include a communication or network interface 4624. Communication interface 4624 enables computer system 4600 to communicate and interact with any combination of remote devices, remote networks, remote entities, etc. (individually and collectively referenced by reference number 4628). For example, communication interface 4624 may allow computer system 4600 to communicate with remote devices 4628 over communications path 4626, which may be wired and/or wireless, and which may include any combination of local area networks (LANs), wide area networks (WANs), the Internet, etc. Control logic and/or data may be transmitted to and from computer system 4600 via communication path 4626.

In an embodiment, a tangible apparatus or article of manufacture comprising a tangible computer useable or readable medium having control logic (software) stored thereon is also referred to herein as a computer program product or program storage device. This includes, but is not limited to, computer system 4600, main memory 4608, secondary memory 4610, and removable storage units 4618 and 4622, as well as tangible articles of manufacture embodying any combination of the foregoing. Such control logic, when executed by one or more data processing devices (such as computer system 4600), causes such data processing devices to operate as described herein.

In another embodiment, the invention is implemented primarily in hardware using, for example, hardware components such as application specific integrated circuits (ASICs), stand alone processors, and/or digital signal processors (DSPs). Implementation of the hardware state machine so as to perform the functions described herein will be apparent to persons skilled in the relevant art(s). In embodiments, the invention can exist as software operating on these hardware platforms.

In yet another embodiment, the invention is implemented using a combination of both hardware and software. Field-programmable gate arrays (FPGA) could, for example, support such an embodiment.

IX. CONCLUSION

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A filter, implemented in hardware, configured to receive an input signal and generate an output signal, the filter comprising:
    a first plurality of stages, wherein the first plurality of stages are cascaded stages; and
    a second plurality of stages, wherein the second plurality of stages are cascaded stages; and
    wherein each of the first plurality of stages and the second plurality of stages is a constituent stage of one of a model filter, $G(z^L)$, for a fixed integer L greater than 1, and a masking filter, $I(z)$, and wherein a cascade of $G(z^L)$ and $I(z)$ forms an interpolated finite impulse response (IFIR) filter.

2. The filter of claim 1, wherein the filter is an analog filter.

3. The filter of claim 1, wherein the filter is a digital filter.

4. The filter of claim 1, wherein each stage of the first plurality of stages has an order of four or greater, wherein each stage of the second plurality of stages has an order of less than four, and wherein a total order of the first plurality of stages is higher than a total order of the second plurality of stages.

5. The filter of claim 1, wherein the first plurality of stages and the second plurality of stages operate at a same data rate.

6. A method for designing a hardware implementation of a filter, comprising:
designing an interpolated finite impulse response (IFIR) filter based on filter specifications, wherein the IFIR filter comprises a cascade of a first finite impulse response (FIR) filter and a second FIR filter, the first FIR filter and the second FIR filter comprising a first plurality of stages and a second plurality of stages respectively; and
sequencing the stages of the first FIR filter and the stages of the second FIR filter, wherein joint sequencing moves one stage of either the first FIR filter and the second FIR filter and places said stage in a different order within its preexisting FIR filter, or moves one stage of either the first FIR filter and the second FIR filter and places said stage in the other FIR filter.

7. The method of claim 6, further including:
incrementally adjusting the filter specifications; and
simplifying one stage of the first plurality of stages or the second plurality of stages without changing any of the remaining stages while conforming to the incrementally adjusted filter specifications, wherein simplifying reduces a sum of a number of full-adders and a number of flip-flops in the filter.

8. The method of claim 6, further including:
implementing the second FIR filter as a second IFIR filter to form a nested IFIR structure, wherein the first IFIR filter is associated with a first stretch factor and the second IF R filter is associated with a second stretch factor.

9. The method of claim 8, wherein implementing includes selecting the first stretch factor and the second stretch factor to minimize a total number of multipliers in the filter.

10. The method of claim 6, further including:
taming the filter to incrementally increase stop-band attenuation of the filter, wherein taming includes re-locating at least one stage of either the first FIR filter and the second FIR filter to an alternative position within the filter.

11. The method of claim 10, wherein re-locating at least one stage includes re locating a stage having a relatively high sum of squares of coefficients.

12. The method of claim 6, further including:
taming the filter to incrementally increase stop-band attenuation of the filter, wherein taming includes manually fusing together two stages of either the first FIR filter or the second FIR filter to form a single substitute stage within the filter.

13. The method of claim 6, further including:
adding a post-filter compensation multiplier at an output of the filter to provide a required gain.

14. The method of claim 13, further including:
taming the filter to incrementally increase stop-band attenuation of the filter, wherein taming includes manually adjusting the post-filter compensation multiplier.

15. The method of claim 6, further including:
adding a data path truncation component at an output of a stage to perform a reduction of a data path bit width of a signal at the output of the stage, wherein the stage is one of the first plurality of stages or one of the second plurality of stages.

16. The method of claim 6, further including:
fusing two or more stages of the first plurality of stages and the second plurality of stages into a combined single stage.

17. The method of claim 6, further including:
rearranging a post-stage multiplier from an initial position following one stage of the first plurality of stages and the second plurality of stages so as to locate the post-stage multiplier to a second position following another stage of the first plurality of stages and the second plurality of stages.

18. The method of claim 6, wherein the filter is a low-pass filter.

19. The method of claim 18, further including:
converting the low-pass filter to a corresponding high-pass filter.

20. The method of claim 6, wherein the filter is an analog filter.

21. The method of claim 6, wherein the filter is a digital filter.

22. The method of claim 6, wherein each coefficient within each of the first FIR filter and the second FIR filter is an exact power of 2.

23. The method of claim 18, further including:
converting the low-pass filter to a corresponding band-pass filter or a corresponding band-stop filter.

24. The method of claim 6, wherein at least one of the first plurality of stages and the second plurality of stages includes a data width adjustment.

25. An optimized hardware-implemented filter associated with a first IFIR sub-filter and a second IFIR sub-filter, the first IFIR sub-filter having a first plurality of cascaded stages and the second IFIR sub-filter having a second plurality of cascaded stages, comprising:
an updated first IFIR sub-filter, wherein one stage of the first plurality of cascaded stages has been removed; and
an updated second IFIR sub-filter, wherein the one stage has been inserted into the second plurality of cascaded stages.

26. A filter, implemented in hardware, comprising:
a cascade of a finite number N of FIR filter stages configured to receive an input signal and generate an output signal, wherein each FIR filter stage implements a respective transfer function $F_k(z)$ for $k=1, \ldots, N$, where N is an integer greater than 2,
wherein all N FIR filter stages operate at a same data rate,
wherein each $F_k(z)$ can be expressed as a polynomial of finite degree in variable $z^{-1}$, said polynomial having real coefficients, and
wherein each FIR filter stage is a constituent stage of one of a model filter, $G(z^L)$, and a masking filter, $I(z)$, L being a stretch factor having an integer value greater than 1, and wherein a cascade of $G(z^L)$ and $I(z)$ forms an interpolated finite impulse response (IFIR) filter.

27. A filter, implemented in hardware, and configured to receive an input signal and to generate an output signal, the filter comprising:
a cascade of a finite number N of FIR filter stages wherein, for a fixed integer $L>1$, the cascade includes at least two stages that respectively implement polynomials $F_1(z)$ and $F_2(z)$, the polynomials having degree $D_1=c_1 \times L$ and $D_2=c_2 \times L$, respectively, where $c_1$ and $c_2$ are both fixed positive integers, for which at least $(D_1-c_1)$ of the $(D_1+1)$ filter coefficients of $F_1(z)$ have value zero, and at least $(D_2-c_2)$ of the $(D_2+1)$ filter coefficients of $F_2(z)$ have value zero, and
wherein each of the at least two stages, $F_1(z)$ and $F_2(z)$, is a constituent stage of a stretched model filter, $G(z^L)$,
wherein the cascade further includes a third stage that implements a polynomial $F_3(z)$, the third stage being a constituent stage of a masking filter, $I(z)$, and
wherein a cascade of $G(z^L)$ and $I(z)$ forms an interpolated finite impulse response (IFIR) filter.

* * * * *